United States Patent
Ukai et al.

(10) Patent No.: US 10,075,664 B2
(45) Date of Patent: Sep. 11, 2018

(54) IMAGE SENSOR

(71) Applicants: Technology hub Inc., Osaka-shi (JP); MegaChips Corporation, Osaka-shi (JP)

(72) Inventors: Yukihiro Ukai, Suita (JP); Takashi Sawada, Nara (JP)

(73) Assignees: Technology Hub Inc., Osaka-shi (JP); MegaChips Corporation, Osaka-shi (JP)

( * ) Notice: Subject to any disclaimer, the term of this patent is extended or adjusted under 35 U.S.C. 154(b) by 39 days.

(21) Appl. No.: 15/422,015

(22) Filed: Feb. 1, 2017

(65) Prior Publication Data

US 2017/0150078 A1 May 25, 2017

(30) Foreign Application Priority Data

Oct. 8, 2014 (JP) .................................. 2014-207141
Jun. 29, 2015 (JP) .................................. 2015-129913

(51) Int. Cl.
*H04N 5/225* (2006.01)
*H04N 5/378* (2011.01)
(Continued)

(52) U.S. Cl.
CPC ....... *H04N 5/378* (2013.01); *H01L 27/14636* (2013.01); *H01L 27/14643* (2013.01);
(Continued)

(58) Field of Classification Search
USPC ................................................ 257/462–465
See application file for complete search history.

(56) References Cited

U.S. PATENT DOCUMENTS 5,581,094 A 12/1996 Hara et al.
8,081,248 B2 12/2011 Matsumoto
(Continued)

FOREIGN PATENT DOCUMENTS

JP 7-122774 5/1995
JP 7-142761 6/1995
(Continued)

OTHER PUBLICATIONS

International Search Report dated Dec. 8, 2015 in PCT/JP2015/076377, filed on Sep. 17, 2015.

*Primary Examiner* — Twyler L Haskins
*Assistant Examiner* — Dwight Alex C Tejano
(74) *Attorney, Agent, or Firm* — Xsensus, LLP

(57) ABSTRACT

A light receiving element includes a first semiconductor layer of a first conductivity type to which a first potential is to be applied, a second semiconductor layer of a second conductivity type formed on the first semiconductor layer, first and second regions of the first conductivity type formed in an upper portion of the second semiconductor layer, a first electrode that is located on the first region and is to be subjected to application of a second potential, a second electrode located on the second region, an insulation layer formed on the second semiconductor layer between the first and the second regions, and a gate electrode that is formed on the insulation layer and is to be subjected to application of a gate voltage. A current readout unit detects, as a pixel signal reflecting an amount of light received, a current flowing from the first region to the second region.

9 Claims, 13 Drawing Sheets

(51) Int. Cl.
  *H01L 27/146* (2006.01)
  *H01L 31/113* (2006.01)
  *H04N 5/232* (2006.01)
  *H04N 5/355* (2011.01)
  *H04N 5/376* (2011.01)

(52) U.S. Cl.
  CPC ..... *H01L 31/1136* (2013.01); *H04N 5/23241* (2013.01); *H04N 5/355* (2013.01); *H04N 5/3765* (2013.01)

(56) References Cited

U.S. PATENT DOCUMENTS

| | | |
|---|---|---|
| 8,569,806 B2 | 10/2013 | Kim |
| 8,610,234 B2 | 12/2013 | Kim |
| 8,653,618 B2 | 2/2014 | Kim |
| 8,669,598 B2 | 3/2014 | Kim |
| 8,669,599 B2 | 3/2014 | Kim |
| 2004/0232494 A1* | 11/2004 | Nagano ............ H01L 21/82385 257/382 |
| 2005/0012167 A1* | 1/2005 | Sawase ............... H01L 27/1463 257/414 |
| 2006/0011956 A1* | 1/2006 | Chijiiwa ........... H01L 27/14609 257/292 |
| 2006/0051886 A1* | 3/2006 | Park .................. G02F 1/136227 438/30 |
| 2006/0138413 A1* | 6/2006 | Yahashi .............. H01L 29/6656 257/57 |
| 2007/0131991 A1* | 6/2007 | Sugawa ........... H01L 27/14603 257/292 |
| 2008/0099797 A1 | 5/2008 | Kerns |
| 2009/0086063 A1* | 4/2009 | Suzuki ............. H01L 27/14603 348/241 |
| 2013/0056708 A1 | 3/2013 | Kim |
| 2014/0347537 A1* | 11/2014 | Hamada ............ H04N 5/23212 348/308 |

FOREIGN PATENT DOCUMENTS

| | | |
|---|---|---|
| JP | 2009-49459 | 3/2009 |
| JP | 2014-529906 | 11/2014 |
| WO | WO 2008/127386 A2 | 10/2008 |

\* cited by examiner

F I G. 1 4
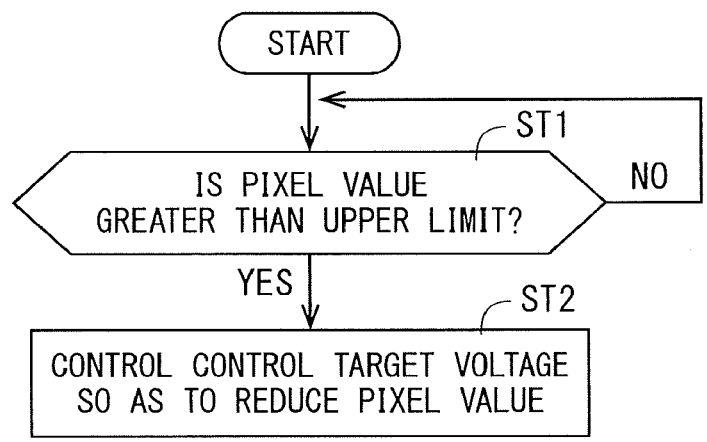

IMAGE SENSOR

BACKGROUND OF THE INVENTION

Field of the Invention

The present invention relates to image sensors.

Description of the Background Art

Charge-coupled device (CCD) image sensors and complementary metal-oxide-semiconductor (CMOS) image sensors have been used widely. Such an image sensor includes photodiodes serving as light receiving elements in pixels. When sensing incident light, each photodiode generates electric current. The photodiode accumulates electric current and then converts accumulated charge into voltage, so that a signal is derived from the corresponding pixel. The signals derived from all of the pixels are assembled into an image signal.

Such an image sensor has an exposure time that is the period over which the above-mentioned current is accumulated. This exposure time is controlled to be responsive to the intensity of light incident upon the photodiodes so that an appropriate image signal can be derived. If the exposure time is relatively long at a high luminous intensity, the amount of charge accumulated in the capacitor component would probably exceed the upper limit value, resulting in blown-out highlights. Thus, the exposure time at a high luminous intensity is shortened in order to avoid such blown-out highlights.

The techniques related to the present invention are listed below as Japanese Patent Application Laid-Open No. 2009-049459, U.S. Pat. Nos. 8,569,806, 8,610,234, 8,653,618, 8,669,598, and 8,669,599.

SUMMARY OF THE INVENTION

Thus, a need exists for development of a light receiving element having a structure that allows for the automatic adjustment of exposure time.

It is an object of the present invention to provide an image sensor including light receiving elements allowing for the automatic adjustment of exposure time.

An image sensor according to a first aspect of the present invention includes at least one light receiving element and a current readout unit. The at least one light receiving element includes a first semiconductor layer of a first conductivity type to which a first power supply potential is to be applied and a second semiconductor layer of a second conductivity type formed on the first semiconductor layer. The at least one light receiving element receives light incident on a junction between the first semiconductor layer and the second semiconductor layer. The at least one light receiving element also includes a first region of the first conductivity type and a second region of the first conductivity type that are formed to be apart from each other in an upper portion of the second semiconductor layer, a first electrode that is located on the first region and is to be subjected to application of a second power supply potential different from the first power supply potential, a second electrode located on the second region, an insulation layer formed on the second semiconductor layer between the first region and the second region, and a gate electrode that is formed on the insulation layer and is to be subjected to application of a gate voltage. The current readout unit includes circuitry configured to detect, as a pixel signal reflecting an amount of light received by the at least one light receiving element, a current flowing from the first region to the second region.

An image sensor according to a second aspect of the present invention is the image sensor according to the first aspect in which the gate electrode is made of a semiconductor of the first conductivity type.

An image sensor according to a third aspect of the present invention is the image sensor according to the first or second aspect that also includes a reset wire to which a reset potential is to be applied and at least one reset switch located between the second semiconductor layer and the reset wire. The at least one reset switch is turned on to reset a potential applied to the second semiconductor layer to the reset potential, and then, the at least one reset switch is turned off. The circuitry of the current readout unit is configured to detect the current as the pixel signal after a lapse of a predetermined period since a turn-off of the at least one reset switch.

An image sensor according to a fourth aspect of the present invention is the image sensor according to the third aspect that also includes a gate voltage generation unit. The gate voltage generation unit includes circuitry configured to receive input of the current flowing in a state in which the at least one reset switch is on and to output a voltage to the gate electrode in such a manner that a difference between the input current and a predetermined current set value falls below a predetermined value.

An image sensor according to the fifth aspect of the present invention is the image sensor according to the fourth aspect that also includes a plurality of gate switches, a plurality of pixel selection switches, and a signal line. The at least one light receiving element includes a plurality of the light receiving elements and the at least one reset switch includes a plurality of the reset switches. Each of the plurality of pixel selection switches is located between the signal line and corresponding one of the plurality of light receiving elements. An output terminal of the circuitry of the gate voltage generation unit is connected with the gate electrode of each of the plurality of light receiving elements through corresponding one of the plurality of gate switches. The circuitry of the current readout unit is configured to detect a current flowing through the signal line. The circuitry of the gate voltage generation unit is configured to repeatedly execute, for each of the plurality of light receiving elements, receiving, from the circuitry of the current readout unit, input of a current flowing through the signal line in a state in which the reset switch that is connected with one of the plurality of light receiving elements is on, and outputting a voltage in such a manner that a difference between the input current and the current set value falls below a predetermined value.

An image sensor according to a sixth aspect of the present invention includes at least one light receiving element, a current readout unit, and a voltage controller. The at least one light receiving element includes a first semiconductor layer of a first conductivity type to which a first power supply potential is to be applied, a second semiconductor layer of a second conductivity type formed on the first semiconductor layer, a first region of the first conductivity type and a second region of the first conductivity type that are formed to be apart from each other in an upper portion of the second semiconductor layer, a first electrode that is located on the first region and is to be subjected to application of a second power supply potential different from the first power supply potential, a second electrode located on the second region, an insulation layer formed on the second semiconductor layer between the first region and the second region, and a gate electrode formed on the insulation layer. The current readout unit includes circuitry configured to detect, as a pixel signal, a current flowing from the first region to the second region. The voltage controller includes circuitry configured to control, based on the pixel signal, a control target voltage being at least one of a gate voltage applied to the gate electrode, the second power supply potential, or a potential applied to the second semiconductor layer.

An image sensor according to a seventh aspect of the present invention is the image sensor according to the sixth aspect that also includes an image statistics processor including circuitry configured to calculate image statistical information based on the pixel signal. The circuitry of the voltage controller is configured to control the control target voltage based on the image statistical information to adjust a sensitivity or a dynamic range of the image sensor.

An image sensor according to an eighth aspect of the present invention is the image sensor according to the sixth or seventh aspect that includes at least one light receiving element. The circuitry of the voltage controller is configured to control the control target voltage for each of a plurality of areas set for the plurality of light receiving elements.

An image sensor according to a ninth aspect of the present invention is the image sensor according to any one of the sixth to eighth aspects. The at least one light receiving element includes a plurality of the light receiving elements. The circuitry of the voltage controller is configured to output the second power supply potential to only part of the plurality of light receiving elements.

In the image sensor according to the first aspect of the present invention, when the gate voltage exceeds a threshold voltage, a channel is formed between the first region and the second region, and then, a current (hereinafter referred to as a "first current") flows from the first electrode to the second electrode accordingly. The first current is dependent on the difference between the gate voltage and the threshold voltage.

The light incident on the junction between the first semiconductor layer and the second semiconductor layer produces the photovoltaic effect, so that a second current responsive to the amount of light is generated and flows through the first electrode, the first region, the second semiconductor layer, and the first semiconductor layer. The potential (bias voltage) applied to the second semiconductor layer is responsive to the second current. That is to say, the bias voltage is dependent on the amount of light.

The threshold voltage varies according to the bias voltage (the body effect). The first current takes on a value corresponding to the bias voltage and eventually corresponding to the amount of light.

In this structure, the exposure time is the period of time starting at the entry of light into the junction and ending when the bias voltage takes on a value corresponding to the amount of light. The exposure time is automatically determined as will be described below in detail.

In the image sensor according to the second aspect of the present invention, an increase in the threshold voltage is avoided.

In the image sensor according to the third aspect of the present invention, the upper limit value of the exposure time is set so as to correspond to the predetermined value.

In the image sensor according to the fourth aspect of the present invention, variations in the bias voltage occurring in the manufacturing process are accommodated.

In the image sensor according to the fifth aspect of the present invention, the gate voltage generation unit is provided for the plurality of light receiving elements. Unlike the case in which the gate voltage generation units correspond one-to-one to the light receiving elements, this structure reduces the circuit size.

In the image sensor according to the sixth and seventh aspects of the present invention, a feedback system responsive to the pixel signals is constituted. Thus, imaging can be performed by the image sensor having properties (e.g., the sensitivity or the dynamic range) suited to an image signal.

In the image sensor according to the eighth aspect the present invention, the properties are controlled per area. This is suited to, for example, computer vision.

In the image sensor according to the ninth aspect of the present invention, only part of the plurality of light receiving elements are activated, whereby the image sensor may be implemented by the activated light receiving elements.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a flowchart illustrating an example operation of a pixel signal control circuit;

DESCRIPTION OF THE PREFERRED EMBODIMENT(S)

First Embodiment

Overall Configuration of Image Sensor

Figure 1:
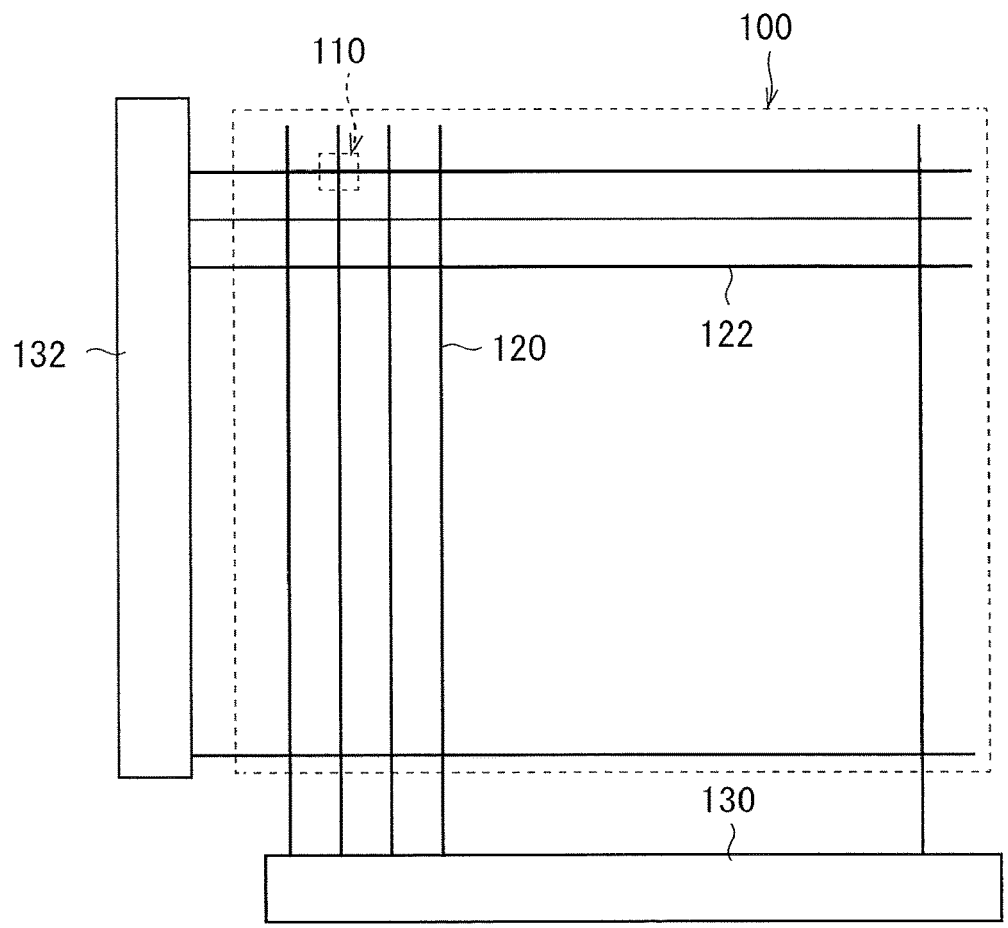
FIG. 1 is a diagram schematically illustrating an example configuration of an image sensor.

FIG. 1 schematically illustrates an example configuration of an image sensor 100. In the illustration of FIG. 1, the image sensor 100 includes a plurality of signal lines 120 and a plurality of signal lines 122. The plurality of signal lines 120 extend in parallel with one another. The plurality of signal lines 122 intersect the plurality of signal lines 120 and extend in parallel with one another. In the illustration of FIG. 1, the signal lines 120 are orthogonal to the signal lines 122.

The areas formed around the intersection points of the signal lines 120 and 122 each include a pixel 110. In the illustration of FIG. 1, the signal lines 120 are orthogonal to the signal lines 122, and thus, a plurality of pixels 110 are arranged in matrix. An internal configuration of the pixel 110 will be specifically described below in detail.

Each signal line 122 is connected with all of the pixels 110 in the corresponding one of rows and is also connected with a row selector 132. The row selector 132 sequentially outputs, to each signal line 122, a signal for selecting all of the pixels 110 in the corresponding one of rows.

Each signal line 120 is connected with all of the pixels 110 in the corresponding one of columns and is also connected with a current readout unit 130. The pixels 110 are selected, one row at a time, and then, the selected pixels 110 induce the electric current responsive to the amount of incident light to flow through the signal lines 120 as will be described below in detail. The current readout unit 130 can read out the electric current as pixel signals. The current readout unit 130 may be a circuit.

As mentioned above, the pixels 110 are sequentially selected, one row at a time, so that the current readout unit 130 can read out the pixel signal from each row. The pixel signals from all of the pixels 110 may be read out in order to produce an image representing the scene imaged by the image sensor 100. This image is composed of the pixel signals from all of the pixels 110, and can form, for example, a screen. Such an image may be repeatedly generated per predetermined period of time, so that a video is generated.

Configuration of Pixel

Figure 2:
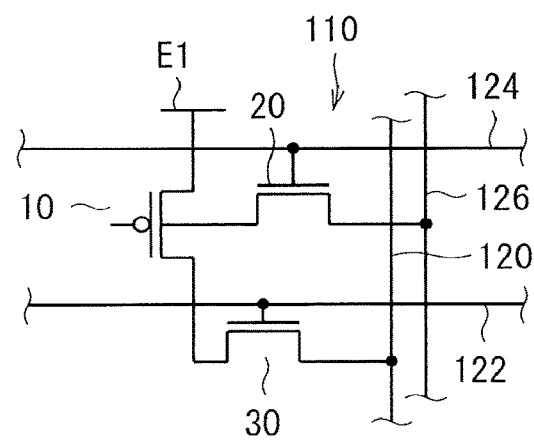
FIG. 2 is a diagram schematically illustrating an example configuration of a pixel.

FIG. 2 shows an equivalent circuit schematically illustrating an example of an internal configuration of the individual pixel 110. The pixel 110 includes a light receiving element 10, a reset switch 20, and a pixel selection switch 30.

Figure 3:
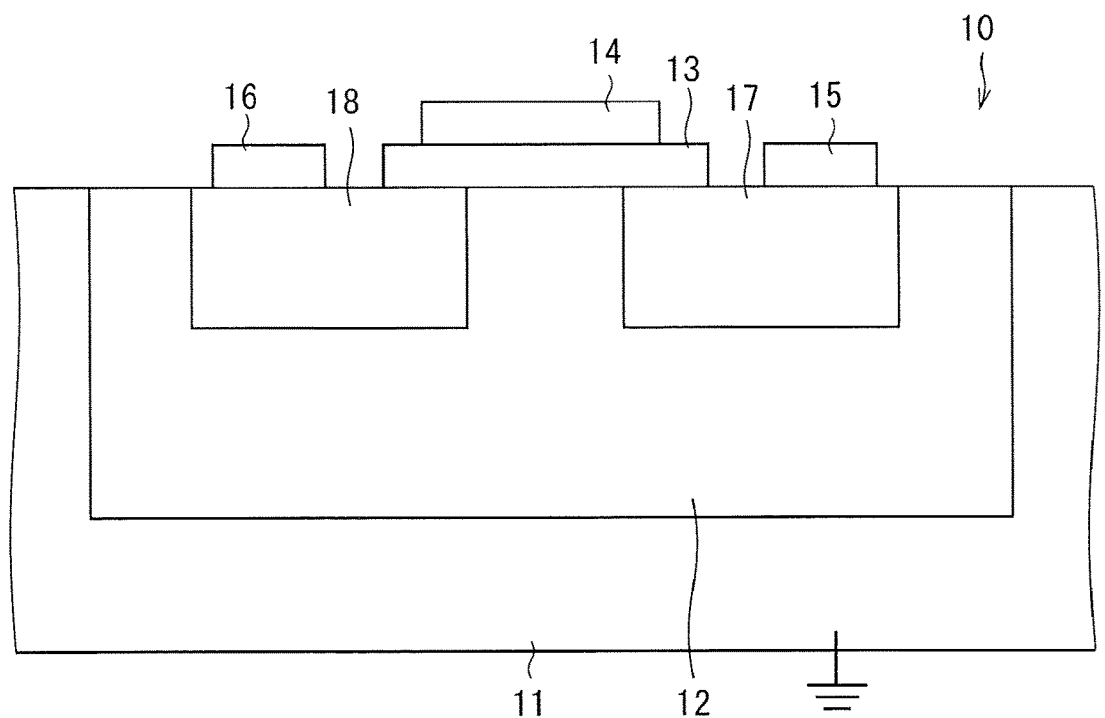
FIG. 3 is a diagram schematically illustrating an example configuration of a light receiving element.

The light receiving element 10 is an element that can receive light. FIG. 3 schematically illustrates an example configuration of the light receiving element 10. The light receiving element 10 includes semiconductor layers 11 and 12, an insulation layer 13, a gate electrode 14, a source electrode 15, and a drain electrode 16.

The semiconductor layer 11 is, for example, a p-type semiconductor layer in which positive holes serve as carriers. Such a p-type semiconductor layer is formed by adding a trivalent element (e.g., boron or aluminum) to a semiconductor made of a tetravalent element (e.g., silicon). A first power supply potential (e.g., ground potential) is to be applied to the semiconductor layer 11.

The semiconductor layer 12 is formed on part of the semiconductor layer 11. The conductivity type of the semiconductor layer 12 is different from the conductivity type of the semiconductor layer 11. For example, the semiconductor layer 12 is an n-type semiconductor layer in which free electrons serve as carriers. Such a semiconductor layer can be formed by adding a pentavalent element (e.g., phosphorus or arsenic) to a semiconductor made of a tetravalent element.

Provided in the upper part of the semiconductor layer 12 are a source region 17 of p-type conductivity and a drain region 18 of p-type conductivity, which is different from the conductivity type of the semiconductor layer 12. The source region 17 and the drain region 18 are formed to be apart from each other in the lateral direction of the drawing plane.

The insulation layer 13 is formed on at least part of the semiconductor layer 12 between the source region 17 and the drain region 18. The insulation layer 13 is made of, for example, silicon oxide.

The gate electrode 14 is formed on the insulation layer 13. The gate electrode 14 is, for example, a semiconductor (of p-type conductivity or n-type conductivity). Such a semiconductor containing a highly concentrated impurity doped for carrier generation functions in a manner substantially similar to a conductor. A predetermined potential (hereinafter also referred to as a "gate voltage Vgs") is to be applied to the gate electrode 14.

The source electrode 15 is formed on the source region 17 and the drain electrode 16 is formed on the drain region 18. The source electrode 15 and the drain electrode 16 may be made of metal (e.g., copper or aluminum). A second power supply potential (e.g., 2V), which is different from the first power supply potential, is to be applied to the source electrode 15.

The above-mentioned structure is similar to the structure of a "metal-oxide-semiconductor (MOS) field-effect transistor".

When the gate voltage Vgs exceeds a threshold voltage Vth, a channel is formed between the source region 17 and the drain region 18 of the light receiving element 10 as in the MOS field-effect transistor. This induces a current IPMOS to flow from the source electrode 15 to the drain electrode 16. The current IPMOS is dependent on the amount of light incident upon the light receiving element 10 as will be described below in detail.

With reference to FIG. 2, one end (the source electrode 15) of the light receiving element 10 is connected with the high potential end of a direct-current power source E1, whereas another end (the drain electrode 16) of the light receiving element 10 is connected with the signal line 120 through the pixel selection switch 30. The pixel selection switch 30 is located between the light receiving element 10 and the signal line 120.

The pixel selection switch 30 is a switch (e.g. a transistor) for use in selecting the pixels 110. When the pixel selection switch 30 is turned on, the light receiving element 10 can induce the current IPMOS to flow through the signal line 120. Then, the current readout unit 130 reads out, as a pixel signal, the current IPMOS flowing through the signal line 120.

A control terminal of the pixel selection switch 30 is connected with the signal line 122. The pixel selection switches 30 of all of the pixels 110 in each row are connected with the corresponding one of the signal line 122. These pixel selection switches 30 are accordingly controlled per row. All of the pixel selection switches 30 in each column are turned on one by one. For example, these pixel selection switches 30 are turned on one after another.

The following will describe the operation of the light receiving element 10 in receiving light. The external light enters the boundary (p-n junction) between the semiconductor layer 11 and the semiconductor layer 12 (see FIG. 3) through, for example, a lens (not shown). The light incident on the p-n junction produces the photovoltaic effect, providing free electrons and positive holes in the p-n junction. The positive holes move to the semiconductor layer 11, whereas the electrons move to the semiconductor layer 12. The p-n junction accordingly functions as a photodiode.

These electrons are accumulated in the semiconductor layer 12, so that the potential (hereinafter also referred to as a "bias voltage Vbs") of the semiconductor layer 12 decreases. The decrease in the bias voltage Vbs brings a diode formed in a junction between the source region 17 and the semiconductor layer 12 into conduction. This induces a current IPD to flow from the source electrode 15 to the semiconductor layer 11.

The threshold voltage Vth decreases as the bias voltage Vbs decreases due to the body effect. The difference between the gate voltage Vgs and the threshold voltage Vth increases as the threshold voltage Vth decreases, thereby increasing the amount of the current IPMOS flowing from the source region 17 to the drain region 18 through the channel.

The bias voltage Vbs is dependent on the current IPD as will be described below in detail. Specifically, the bias voltage Vbs decreases as the current IPD increases. The current IPMOS increases with increasing amount of light. Thus, the current IPMOS finds use as a pixel signal. More specifically, with reference to FIG. 2, when the pixel selection switch 30 is turned on, the current IPMOS flows through the signal line 120. Then, the current readout unit 130 detects, as a pixel signal, the current IPMOS flowing through the signal line 120.

In the illustration of FIG. 2, the reset switch 20 is provided. The reset switch 20 is a switch (e.g., a transistor) for use in initializing the bias voltage Vbs applied to the semiconductor layer 12 and is located between the semiconductor layer 12 and a reset wire 126. A reset potential (e.g., a potential equal to the potential applied to the source electrode 15) is to be applied to the reset wire 126. The pixel selection switch 30 is firstly turned on and the pixel signal is read out, and then, the reset switch 20 is turned on. The bias voltage Vbs applied to the semiconductor layer 12 is accordingly reset to the reset potential (hereinafter also referred to as an "initial value"). The current IPMOS is also initialized accordingly.

When the reset switch 20 is turned off, the bias voltage Vbs applied to the semiconductor layer 12 takes on a value corresponding to the amount of light as before. When the pixel selection switch 30 is turned on, the current IPMOS also takes on a value corresponding to the amount of light and the resultant current IPMOS is read out. From that time forward, the above-mentioned operation is repeated, whereby the pixel signal is repeatedly read out from the individual pixel 110 per predetermined period of time.

In the illustration of FIG. 2, a control terminal of the reset switch 20 is connected with a reset signal line 124. The reset signal line 124 may be connected with control terminals of the reset switches 20 of all of the pixels 110 in the same row. In this case, these reset switches 20 are controlled per row. The reset signal line 124 may be connected with the row selector 132. That is to say, the row selector 132 may control the reset switches 20. The row selector 132 may be a circuit.

Exposure Time

The exposure time of the light receiving element 10 will now be described. The exposure time is the period of time starting at the entry of light and ending when the pixel signal takes on a value corresponding to the amount of light. In the present embodiment, the exposure time is regarded as the period of time starting at the turn-off of the reset switch 20 and ending when the bias voltage Vbs applied to the semiconductor layer 12 takes on a value corresponding to the amount of light. The reason for this is that the current IPMOS takes on a value corresponding to the amount of light whenever the bias voltage Vbs takes on a value corresponding to the amount of light as mentioned above.

Figure 4:
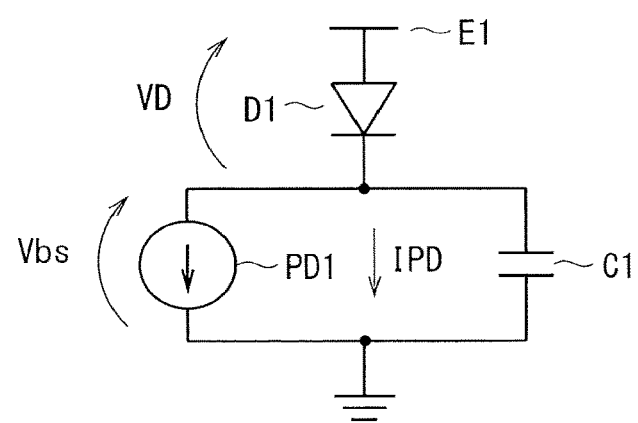
FIG. 4 is a diagram schematically illustrating an equivalent circuit extending from a source electrode to a semiconductor layer.

In association with the exposure time, the following will firstly examine the bias voltage Vbs applied to the semiconductor layer 12. FIG. 4 schematically illustrates, in the form of an equivalent circuit, a configuration extending from the source electrode 15 to the semiconductor layer 11.

A current source PD1 corresponds to the photodiode being the p-n junction between the semiconductor layer 11 and the semiconductor layer 12. The current delivered by the current source PD1 is approximately proportionate to the amount of light incident on the p-n junction between the semiconductor layer 11 and the semiconductor layer 12. A capacitor C1 represents the electrostatic capacitance between the semiconductor layer 11 and the semiconductor layer 12, and is connected in parallel with the current source PD1. A diode D1 corresponds to the p-n junction between the source region 17 and the semiconductor layer 12. The capacitor C1 and the current source PD1 are connected in series with the diode D1 between the high potential end and the low potential end of the direct-current power source E1. The low potential end of the direct-current power source E1 is grounded. The high potential produced by the direct-current power source E1 is hereinafter referred to as a "potential Vcc".

Figure 5:
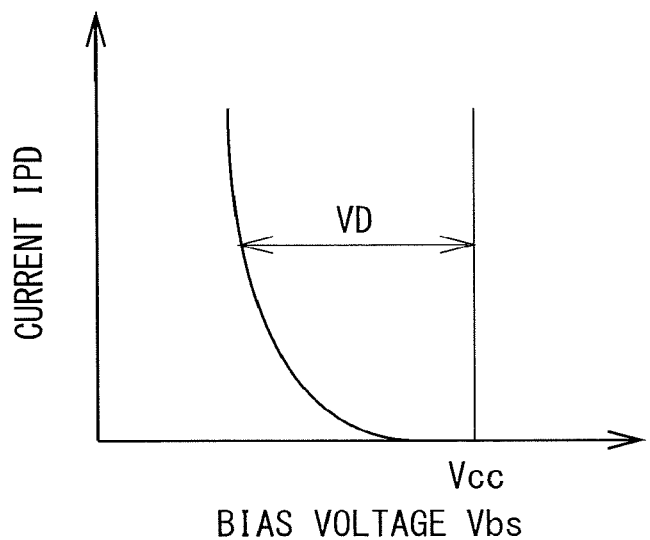
FIG. 5 is a diagram schematically illustrating an example of the relation between a bias voltage and a current.

When the light receiving element 10 receives light, the current source PD1 induces the current IPD which is approximately proportional to the amount of the received light. The capacitor C1 accordingly discharges through the current source PD1. This results in a decrease in the bias voltage Vbs applied to the semiconductor layer 12 as mentioned above. The decrease in the bias voltage Vbs brings the diode D1 into conduction. When the current flowing through the diode D1 coincides with the current IPD, the capacitor C1 stops discharging, so that the bias voltage Vbs takes on a value corresponding to the amount of light. FIG. 5 is a graph schematically illustrating an example of the correspondence between the current IPD and the bias voltage Vbs. The bias voltage Vbs decreases as the current IPD increases. The rate of the change in the bias voltage Vbs relative to the current IPD decreases as the current IPD increases. That is to say, in the area where the amount of the current IPD is small, the bias voltage Vbs decreases significantly as the current IPD increases. In the area where the amount of the current IPD is large, meanwhile, the bias voltage Vbs decreases slightly as the current IPD increases.

This occurs because a voltage VD (=Vcc−Vbs) applied to the diode D1 increases non-linearly relative to the current. The relation between the voltage VD and the current has been known. Specifically, the current flowing through the diode D1 increases exponentially relative to the voltage VD applied to the diode D1.

The exposure time is the period of time required for the bias voltage Vbs to shift from the initial value to the potential corresponding to the current IPD (see FIG. 5). The bias voltage Vbs can be regarded as the voltage applied to the capacitor C1. Thus, the exposure time can be regarded as the period of time over which the capacitor C1 discharges until the voltage applied to the capacitor C1 shifts from the initial value to the above-mentioned potential.

The discharge time of the capacitor C1 decreases with increasing amount of current flowing from the capacitor C1 and increases with increasing amount of change in the bias voltage Vbs (the voltage applied to the capacitor C1). As is evident from FIG. 5, in the area where the amount of the current IPD is relatively large, the bias voltage Vbs decreases slightly as the current IPD increases. The effect of the increased current in reducing the discharge time surpasses the effect of the increased change in the bias voltage Vbs in increasing the discharge time. Thus, the period of time required for the capacitor C1 to discharge decreases as the current IPD increases. That is to say, the exposure time decreases with increasing amount of light.

As described above, the image sensor 100 automatically determines the exposure time according to the amount of light. Specifically, the exposure time is determined such that the exposure time decreases with increasing amount of light. Unlike the conventional CCD image sensors or the conventional CMOS sensors, this configuration eliminates the need for calculating the exposure time based on the amount of light. This leads to easy control.

Relation Between Amount of Light and Current IPMOS

The following will examine the relation between the amount of light and the current IPMOS. The structure of the light receiving element 10 is similar to that of the MOS field-effect transistor. It is thus considered that the relation among various types of voltage applied to the light receiving element 10 conforms to the relation among the corresponding types of voltage applied to the MOS field-effect transistor. The threshold voltage Vth is given by the following expression.

$$|Vth|=|Vth0|+\gamma\{\sqrt{(2 \cdot \varphi F+Vbs)}-\sqrt{(2 \cdot \varphi F)}\} \quad (1)$$

Vth0 denotes the threshold voltage Vth in the state in which the bias voltage Vbs is set at zero, $\gamma$ denotes the body factor, and $\varphi F$ denotes the Fermi potential.

Figure 6:
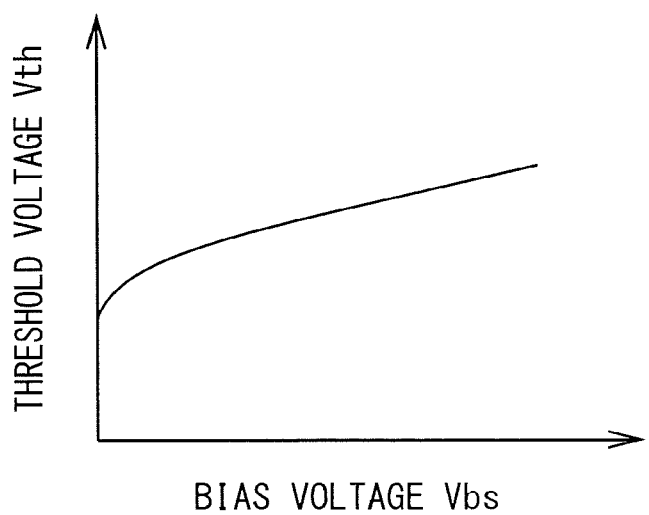
FIG. 6 is a diagram schematically illustrating an example of the relation between the bias voltage and a threshold voltage.

FIG. 6 is an example graph representing Expression (1). To put it simply, as is evident from FIG. 6, the threshold voltage Vth is approximately proportionate to the square root of the bias voltage Vbs.

The current IPMOS is given by the following expression.

$$IPMOS=\beta \cdot (|Vgs|-|Vth|)^2/2 \quad (2)$$

$\beta$ is a constant determined by, for example, the channel size and the material of the semiconductor layer 12. A^B represents A to the Bth power.

As represented by Expression (2), the current IPMOS is proportionate to the square of the difference between the gate voltage Vgs and the threshold voltage Vth. In the interest of simplicity, it is considered that the current IPMOS varies approximately in proportion to the square of the threshold voltage Vth.

It is considered that the threshold voltage Vth is approximately proportionate to the square root of the bias voltage Vbs and that the current IPMOS is approximately proportionate to the square of the threshold voltage Vth. It is thus considered that the current IPMOS is approximately proportionate to the bias voltage Vbs. This is represented by the following expression.

$$IPMOS \propto Vbs \quad (3)$$

The current IPD increases exponentially relative to the voltage VD due to the properties of the diode D1. Conversely, the voltage VD is proportionate to the logarithm of the current IPD. The bias voltage Vbs is accordingly proportionate to the logarithm of the current IPD. This is represented by the following expression.

$$Vbs \propto LN(IPD) \quad (4)$$

LN(A) represents the logarithm of A whose base is the Napier's constant.

Given that the current IPD is approximately proportionate to a light amount Lux, Expression (5) is derived from Expression (3) and Expression (4).

$$IPMOS \propto LN(Lux) \quad (5)$$

Figure 7:
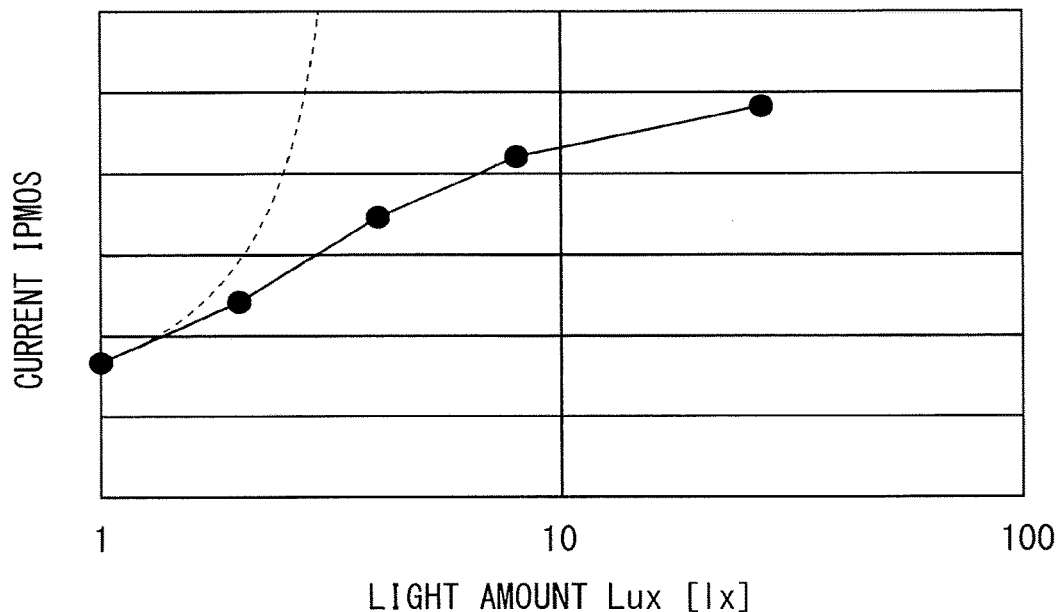
FIG. 7 is a diagram schematically illustrating an example of the relation between the amount of light and the current.

As mentioned above, the current IPMOS is approximately proportionate to the logarithm of the light amount Lux. FIG. 7 schematically illustrates an example of experimental results associated with the relation between the light amount Lux and the current IPMOS. This relation is represented by a line graph. As illustrated in FIG. 7, the current IPMOS is approximately proportionate to the logarithm of the light amount Lux.

As for the conventional CCD image sensor or the like, meanwhile, the current IPD that flows through the photodiode and is proportionate to the amount of light is accumulated in the capacitor component, and then, the value of the voltage applied to the capacitor component is read out as a pixel signal. In such a CCD image sensor, the value of voltage (pixel signal) increases in proportion to the light amount Lux. In the illustration of FIG. 7, the changes in the value of voltage relative to the light amount Lux are diagrammatically shown by a broken line. Although there is a difference between the initial value of the current IPMOS and the initial value of the above-mentioned voltage, FIG. 7 disregards such a difference and illustrates differences between the changes in the current IPMOS and the changes in the above-mentioned voltage relative to the light amount Lux.

For the image sensor 100, the current IPMOS is used in place of the current IPD. The current IPMOS is proportionate to the logarithm of the light amount Lux. As the light amount Lux increases, the current IPMOS increases more gradually relative to a rise in the light amount Lux.

Such an image sensor has an upper limit value placed on the pixel signal so as to properly read out the pixel signal. The CCD image sensor has an upper limit value placed on the voltage to be applied to the capacitor component. The image sensor 100 has an upper limit value placed on the current IPMOS.

In the image sensor 100, as the current IPMOS approaches its upper limit, the current IPMOS increases more gradually relative to a rise in the light amount Lux as mentioned above. This increases the value of the light amount Lux corresponding to the upper limit of the current IPMOS. The dynamic range of the image sensor 100 can be expanded accordingly.

The CCD image sensor or the like typically controls the exposure time according to the amount of light in order to expand the dynamic range. Meanwhile, the image sensor 100 can expand the dynamic range without the need for controlling the exposure time. The dynamic range of the conventional CCD image sensor or the like is about 60 dB, whereas the dynamic range of the image sensor 100 can be about 120 dB. This provides, for example, 1000 times improvement in the dynamic range.

Timing Chart

Figure 8:
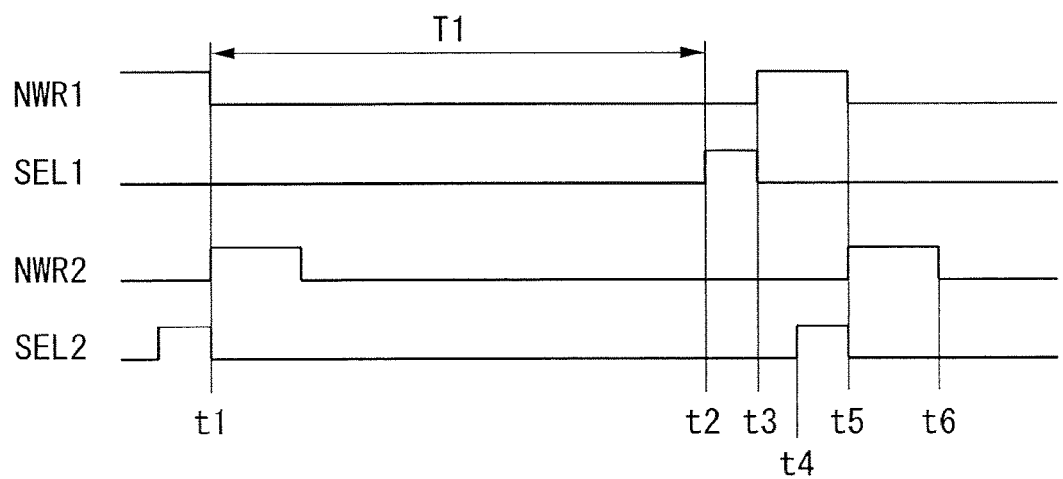
FIG. 8 is a diagram schematically illustrating an example timing chart.

FIG. 8 schematically illustrates an example timing chart of the image sensor 100. Illustrated in FIG. 8 are signals NWR1, NWR2, SEL1, and SEL2. The signal NWR1 is output to the reset signal line 124 in the first row and the signal NWR2 is output to the reset signal line 124 in the second row. The signal SEL1 is output to the signal line 122 in the first row and the signal SEL2 is output to the signal line 122 in the second row. Although signals are output to the signal lines 122 and the reset signal lines 124 in the third and subsequent rows in actuality, FIG. 8 omits these signals.

FIG. 8 illustrates an example timing chart for the "rolling shutter method". The specific details will be given below.

The signal NWR1 is active in the initial state. The reset switches 20 of the pixels 110 in the first row are in the "on" state, and thus, the bias voltage Vbs applied to the light receiving elements 10 in the pixels 110 in the first row is accordingly reset to the initial value. The signal SEL1 is inactive in the initial state. The pixel selection switches 30 of the pixels 110 in the first row are in the "off" state, and thus, no pixels 110 in the first row are selected.

The signal NWR1 is deactivated at a point in time t1. The reset switches 20 of the pixels 110 in the first row are turned off accordingly. Then, the bias voltage Vbs applied to the light receiving elements 10 of the pixels 110 in the first row begins to shift to a value corresponding to the light amount Lux. After a lapse of the exposure time corresponding to the light amount Lux, the bias voltage Vbs takes on a value corresponding to the light amount Lux as mentioned above.

The signal SEL1 is activated at a point in time t2 which comes after a lapse of a predetermined period T1 since the point in time t1. The pixel selection switches 30 of the pixels 110 in the first row are turned on accordingly. This means that the pixels in the first row are selected. The light receiving elements 10 in the first row cause the current IPMOS responsive to the light amount Lux to flow to the signal lines 120 through the respective pixel selection switches 30.

The signal SEL1 is deactivated at a point in time t3 which comes after a lapse of a predetermined time since the point in time t2. The pixel selection switches 30 of the pixels 110 in the first row are turned off accordingly.

The current readout unit 130 detects, as pixel signals, the current IPMOS flowing through the signal lines 120 over the period between the point in time t2 and the point in time t3. For example, the current readout unit 130 converts the current IPMOS into a voltage and outputs the value of the resultant voltage to an analog-digital converter (not shown) or the like. The analog-digital converter convers the analog data indicative of the value of voltage into the digital data.

The predetermined period T1 in the above-mentioned operation indicates the upper limit value of the exposure time. The exposure time for the image sensor 100 automatically extends as the light amount Lux decreases. When the light amount Lux is close to zero, the exposure time comes close to the infinite value in theory. It is for this reason that the upper limit value of the exposure time is set based on the predetermined period T1. The pixel signals can be acquired after a lapse of the predetermined period T1 at the maximum.

In the illustration of FIG. 8, the signal NWR1 is activated at the point in time t3. The reset switches 20 of the pixels 110 in the first row are turned on accordingly. Then, the bias voltage Vbs applied to the light receiving elements 10 in the first row begins to shift to the initial value. At a point in time t5 which comes after a lapse of a period of time sufficient for the bias voltage Vbs to shift to the initial value, the signal NWR1 is deactivated again. From that time forward, the above-mentioned operation is repeated.

Although the signals NWR2 and SEL2 associated with the pixels 110 in the second row are activated and deactivated in a manner respectively similar to the signal NWR1 and the signal SEL1 associated with the pixels 110 in the first row, there is a time lag between these events. That is to say, the signal NWR2 is activated after the signal NWR1 is deactivated and the signal SEL2 is activated after the signal SEL1 is deactivated. The pixel signals from the pixels 110 in the second row are read out after the pixel signals from the pixels 110 in the first row are read out. The bias voltage Vbs applied to the light receiving elements 10 in the second row are initialized after the bias voltage Vbs applied to the light receiving elements 10 in the first row are initialized.

The same holds true for the pixels 110 in the third and subsequent rows. The operation associated with the pixels 110 in the n-th row lags behind the operation associated with the pixels 110 in the (n−1)th row.

The period (frame period) between the point in time t1 and the point in time t5 is set to be longer than or equal to the period obtained by multiplying the duration of the "on" state of the pixel selection switches 30 by the number of rows, so that the pixel signals are read out from the pixels 110 in all of the rows, and then, are read out from the pixels 110 in the first row again.

Material of Gate Electrode

The threshold voltage Vth may increase due to the use of the gate electrode 14 made of a semiconductor of the conductivity type different from that of the source region 17 and the drain region 18 (e.g., an n-type semiconductor) in place of the gate electrode 14 made of a semiconductor of the same conductivity type as that of the source region 17 and the drain region 18. In this case, the threshold voltage Vth needs to be reduced in a manner to adjust the concentration of the impurity in a channel region of the semiconductor layer 12. For example, the channel region may be buried in the semiconductor layer 12 instead of being provided on the surface of the second semiconductor layer 12.

It is preferred that the gate electrode 14 be made of a semiconductor of the same conductivity type as that of the source region 17 and the drain region 18 (e.g., a p-type semiconductor). This configuration facilitates the manufacturing of the image sensor 100 while such an increase in the threshold voltage Vth can be avoided.

Adjustment of Gate Voltage

The threshold voltage Vth may not be uniform across the different pixels 110 due to variations occurring in the manufacturing process. That is to say, the threshold voltage Vth varies across the different pixels 110. The variations in the threshold voltage Vth lead to errors in the current IPMOS which is supposed to be responsive to the light amount Lux. The reason for this is that, as is evident from Expression (2), the current IPMOS is dependent on the difference between the gate voltage Vgs and the threshold voltage Vth. These variations in the threshold voltage Vth may be accommodated in the following manner.

The current IPMOS is dependent on the difference between the gate voltage Vgs and the threshold voltage Vth. Thus, the values of the gate voltage Vgs applied to the individual light receiving elements 10 may be adjusted according to the variations in the threshold voltage Vth, thereby reducing errors in the current IPMOS attributable to the variations in the threshold voltage Vth.

The current IPMOS that flows in response to the application of the same bias voltage Vbs to the individual pixels 110 reflects the variations in the threshold voltage Vth among the individual pixels 110. Thus, the gate voltage Vgs may be adjusted according to the current IPMOS flowing through the individual light receiving elements 10.

Figure 9:
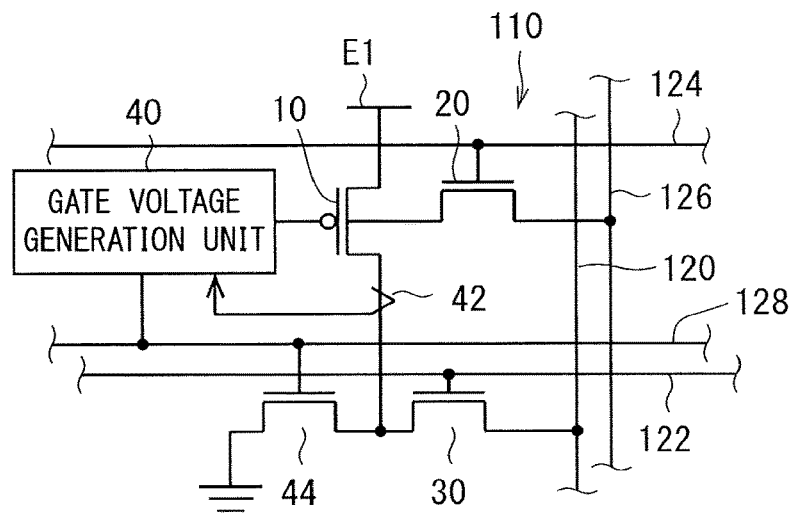
FIG. 9 is a diagram schematically illustrating an example configuration of the pixel.

FIG. 9 schematically illustrates an example of the internal configuration of the individual pixel 110. Unlike the pixel 110 in FIG. 2, the pixel 110 in the illustration of FIG. 9 further includes a gate voltage generation unit 40, a current readout unit 42, and a setting switch 44.

The setting switch 44, which may be a transistor, is connected in series with the light receiving element 10 between the high potential end and the low potential end (ground) of the direct-current power source E1. When the setting switch 44 is turned on, the current IPMOS responsive to the light amount Lux flows. The path taken by this current is different from the path passing through the pixel selection switch 30 and the signal line 120.

The setting switch 44 is turned on in the state in which the reset switch 20 is turned on. That is to say, the current IPMOS flowing in response to the turn-on of the setting switch 44 is regarded as the current flowing in the state in which the bias voltage Vbs takes on the initial value.

The control terminal of the setting switch 44 is connected with a setting signal line 128. For example, a plurality of setting signal lines 128 extend in parallel with the signal lines 122 and each setting line 128 is commonly connected to the setting switches 44 of all of the pixels 110 in the corresponding one of rows. In this case, the setting switches 44 are controlled per row. The setting signal lines 128 are connected to the row selector 132. The row selector 132 outputs signals to the setting signal lines 128 on as-needed basis.

The current readout unit 42 detects the current IPMOS that flows in response to the turn-on of the setting switch 44. That is to say, the current readout unit 42 detects the current IPMOS in the state in which the bias voltage Vbs takes on the initial value. The detected current IPMOS is output to the gate voltage generation unit 40. In the illustration of FIG. 9, the current readout unit 42 is located between the light receiving element 10 and the setting switch 44. Alternatively, the current readout unit 42 may be located between the setting switch 44 and the ground. In this case, the current IPMOS (pixel signal) that flows through the signal line 120 in response to the turn-on of the pixel selection switch 30 does not pass through the current readout unit 42. The current IPMOS is thus unaffected by the current readout unit 42.

The gate voltage generation unit 40 receives the input of the current IPMOS from the current readout unit 42. Then, the gate voltage Vgs generated based on the input current IPMOS is output from the gate voltage generation unit 40 to the gate electrode 14 of the light receiving element 10. Specifically, the gate voltage generation unit 40 adjusts the gate voltage Vgs in such a manner that the difference between the current IPMOS and a predetermined current set value falls below a predetermined value. The adjustment of voltage level can be made by a known circuit, which will not be described here in detail. Examples of such a circuit include an amplifier circuit having a controllable amplification factor.

The gate voltage Vgs is adjusted in the above-mentioned manner in all of the pixels 110. The gate voltage Vgs is thus adjusted according to the variations in the threshold voltage Vth. The variations in the threshold voltage Vth can be accommodated accordingly.

The gate voltage generation unit 40 is required to adjust the gate voltage Vgs according to the current IPMOS that flows in response to the turn-on of the setting switch 44. It is only required that the gate voltage generation unit 40 perform the adjustment while the setting switch 44 is in the "on" state. For this reason, the setting signal line 128 in the illustration of FIG. 9 is also connected with the gate voltage generation unit 40.

Figure 10:
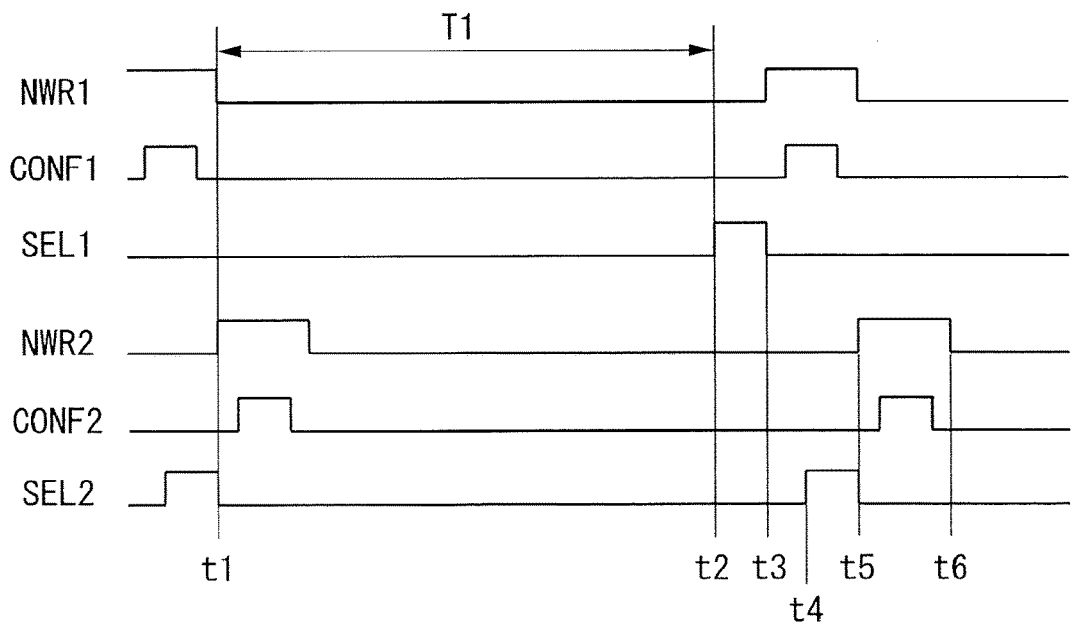
FIG. 10 is a diagram schematically illustrating an example timing chart.

FIG. 10 schematically illustrates an example timing chart of the image sensor 100. The illustration of FIG. 10 additionally includes a signal CONF1 output to the setting signal line 128 in the first row and a signal CONF2 output to the setting signal line 128 in the second row.

The signal CONF1 is in the "on" state only while the signal NWR1 in the first row is active (only while the reset switches 20 in the first row are in the "on" state). Thus, the setting switches 44 in the first row are turned on in the state in which the bias voltage Vbs applied to the light receiving elements 10 in the first row takes on the initial value. When the setting switches 44 are turned on, the light receiving elements 10 in the first row cause the current IPMOS to flow in a manner to reflect variations in the threshold voltage Vth. Thus, the current IPMOS flowing through different light receiving elements 10 have different values. Each current readout unit 42 in the first row detects the current IPMOS and outputs the detection result to the corresponding gate voltage generation unit 40. The gate voltage generation unit 40 adjusts the gate voltage Vgs in such a manner that the difference between the input current IPMOS and the predetermined current set value falls below the predetermined value, and then, outputs the resultant voltage to the corresponding light receiving elements 10.

The individual light receiving elements 10 in the first row cause approximately equal amount of the current IPMOS to flow in the state in which the common bias voltage Vbs (the initial value) is applied. The variations in the threshold voltage Vth among the light receiving elements 10 in the first row are accommodated accordingly.

Once the signal CONF1 is deactivated, the gate voltage Vgs is kept at the adjusted value until the signal CONF1 is activated again. This means that the gate voltage Vgs is kept at the adjusted value during the above-mentioned period including a readout period (a period over which the signal SEL1 is active). Thus, the current IPMOS responsive to the amount of light can flow in the state in which variations in the threshold voltage Vth are accommodated. This can reduce errors in the current IPMOS attributable to the variations in the threshold voltage Vth.

The same holds true for the second and subsequent rows, and thus, the following will not repetitively describe the operation.

Figure 11:
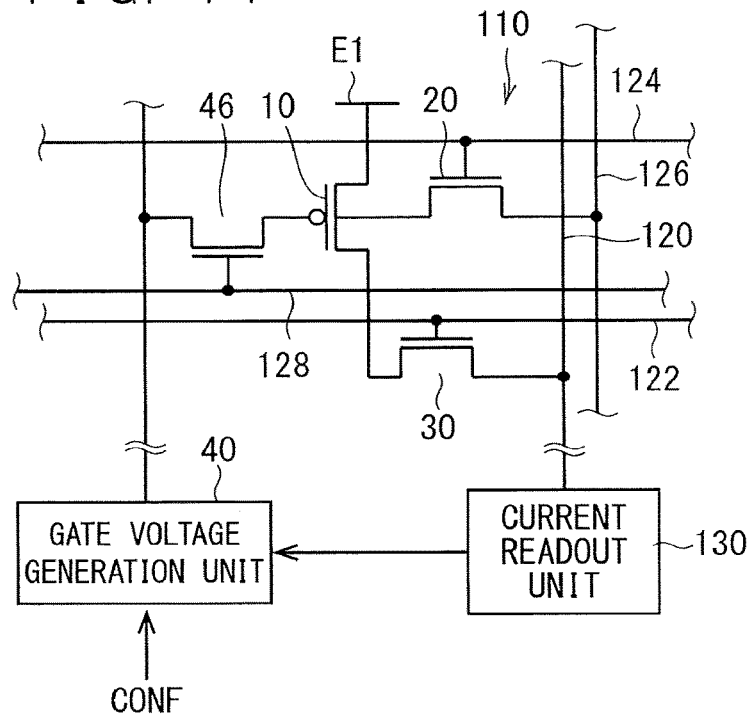
FIG. 11 is a diagram schematically illustrating an example configuration of the pixel.

In the illustration of FIG. 9, each pixel 110 includes the gate voltage generation unit 40, which is not limited to this configuration. FIG. 11 schematically illustrates another example of the internal configuration of the individual pixel 110. In the illustration of FIG. 11, the gate voltage generation unit 40 is not included in the pixel 110 and is located outside the pixel 110. The individual pixel 110 includes a gate switch 46 in place of the setting switch 44.

In the illustration of FIG. 10, each gate voltage generation unit 40 is provided for all of the light receiving elements 10 in the corresponding one of columns. In other words, the gate voltage generation units 40 correspond one-to-one to the columns. Each gate voltage generation unit 40 receives the input of the current IPMOS that flows through the corresponding one of columns and has been read out by the current readout unit 130. For example, the gate voltage generation unit 40 in the first column receives the input of the current IPMOS flowing through the first column.

The gate switch 46 is located between the gate electrode 14 of the light receiving element 10 and the gate voltage generation unit 40. In other words, the output terminal of the gate voltage generation unit 40 is connected with the gate electrode 14 of the light receiving element 10 through the gate switch 46. In the illustration of FIG. 11, the control terminal of the gate switch 46 is connected with the setting signal line 128. The setting signal lines 128 extend in parallel with the signal lines 122 and each setting signal line 128 is commonly connected with the control terminals of the gate switches 46 of all of the pixels 110 in the corresponding one of rows. The gate switches 46 are controlled per row.

The gate voltage generation unit 40 repeatedly performs the following operation for each of the light receiving elements 10 as will be described below with reference to FIG. 12. The gate voltage generation unit 40 receives, from the current readout unit 130, the input of the current IPMOS flowing through the signal line 120 in the state in which the reset switch 20, the gate switch 46, and the pixel selection switch 30 that are connected with one of the light receiving elements 10 are turned on. Then, the gate voltage generation unit 40 outputs the voltage in such a manner that the difference between the input current IPMOS and the current set value falls below the predetermined value.

Figure 12:
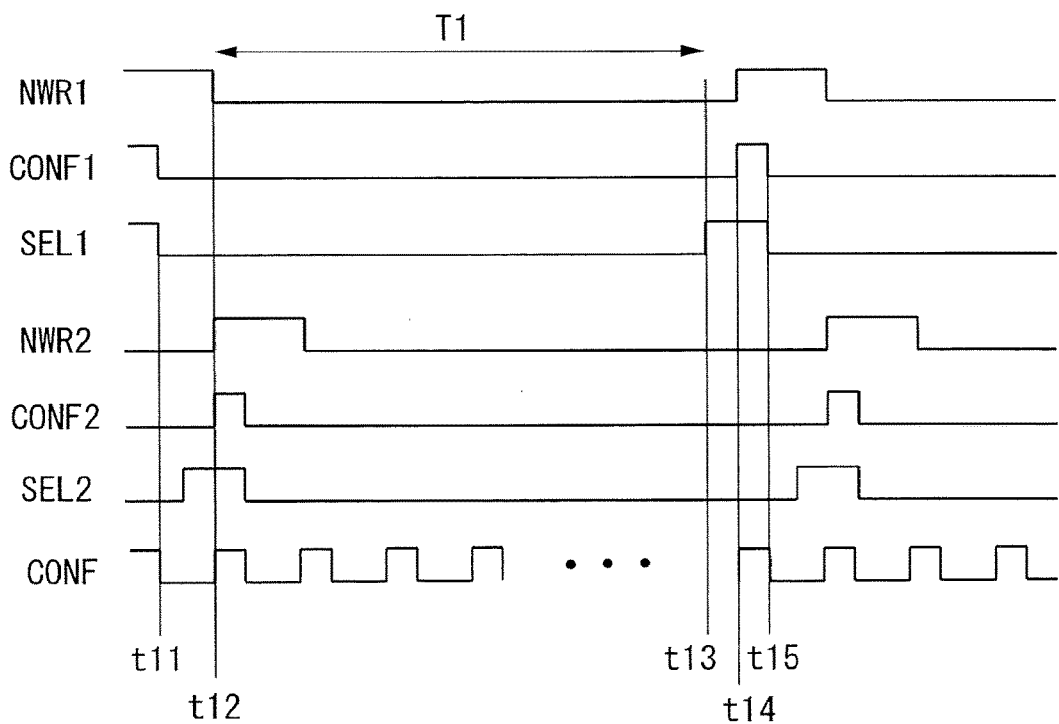
FIG. 12 is a diagram schematically illustrating an example timing chart.

FIG. 12 illustrates an example timing chart of the image sensor 100. In the illustration of FIG. 12, the signals NWR1, CONF1, SEL1 are active over the period between the starting point and a point in time t11. Thus, the reset switches 20, the gate switches 46, and the pixel selection switches 30 in the first row are placed in the "on" state over this period.

While the reset switches 20 in the first row are in the "on" state, the bias voltage Vbs applied to the light receiving elements 10 in the first row takes on the initial value. While the pixel selection switches 30 in the first row are in the "on" state, the current IPMOS flows from each of the light receiving elements 10 through the corresponding one of the signal lines 120. The current readout unit 130 reads out the current IPMOS flowing through each of the signal lines 120 and outputs the current IPMOS to the corresponding one of the gate voltage generation units 40.

While the gate switches 46 in the first row are in the "on" state, the output from the gate voltage generation unit 40 is applied onto the gate electrodes 14 of the light receiving elements 10 in the first row. The gate voltage generation unit 40 adjusts the output voltage in such a manner that the difference between the input current IPMOS and the current set value falls below the predetermined value, and then, outputs the resultant voltage. The output voltage, which is the gate voltage Vgs, is applied to the light receiving elements 10 in the first row.

The signals CONF1 and SEL1 are deactivated at the point in time t11. The gate switches 46 and the pixel selection switches 30 in the first row are turned off accordingly. In response to the turn-off of the gate switches 46 in the first row, the gate voltage Vgs applied to the individual light receiving element 10 in the first row is kept at the parasitic capacitance of the relevant light receiving element 10 in the first row. In response to the turn-off of the pixel selection switches 30 in the first row, the amount of the current IPMOS flowing through the individual signal line 120 temporarily becomes zero.

The signal NWR1 is deactivated at a point in time t12 which comes after the point in time t11. The reset switches 20 in the first row are accordingly turned off. Thus, the value of the bias voltage Vbs applied to the individual light receiving element 10 in the first row begins to shift to a value corresponding to the amount of light. After a lapse of the exposure time corresponding to the amount of light, the bias voltage Vbs applied to the individual light receiving element 10 in the first row takes on the value corresponding to the amount of light.

The signal SEL1 is activated at a point in time t13 which comes after a lapse of the predetermined period T1 since the point in time t12. The pixel selection switches 30 in the first row are turned on accordingly. Thus, the individual light receiving element 10 in the first row causes the current IPMOS responsive to the amount of light to flow through the signal line 120.

The signals NWR1 and CONF1 are activated at a point in time t14 which comes after the point in time t13. The reset switches 20 and the gate switches 46 in the first row are turned on accordingly. Thus, the bias voltage Vbs applied to the individual light receiving element 10 takes on the initial value again, and the current IPMOS flowing through the individual signal line 120 no longer reflects the amount of light. The signals CONF1 and SEL1 are deactivated at a point in time t15 which comes after the point in time t14. Consequently, the amount of the current IPMOS becomes zero again.

The current IPMOS that flows over the period between the point in time t13 and the point in time t14 reflects the amount of light. The current readout unit 130 reads out, as pixel signals, the current IPMOS that flows over this period.

Meanwhile, the current IPMOS that flows through the individual signal line 120 over the period between the point in time t14 and the point in time t15 is obtained when the bias voltage Vbs takes on the initial value. The relevant current IPMOS is used to determine the gate voltage Vgs. The current IPMOS that flows over this period is output to the corresponding gate voltage generation unit 40 by the current readout unit 130. The gate voltage generation unit 40 adjusts the gate voltage Vgs according to the input current IPMOS. From that time forward, the above-mentioned operation is repeated.

Although the operation in the second and subsequent rows is performed as in the first row, the operation in n-th row lags behind the operation in the (n−1)th row such that the operation is sequentially performed, one row at a time.

Although each gate voltage generation unit 40, which is provided for all of the light receiving elements 10 in the corresponding one of columns as mentioned above, can apply the appropriate gate voltage Vgs to the light receiving elements 10 on an individual basis. Unlike the case in which the gate voltage generation units 40 correspond one-to-one to the pixels 110, this structure requires a smaller number of gate voltage generation units 40. The circuit size and the manufacturing cost can be reduced accordingly.

It is only required that the gate voltage generation unit 40 operate while at least one of the signals output to the setting signal line 128 is active. The gate voltage generation unit 40 may be configured to receive the input of a signal CONF which is the logical sum of the signals output to the setting signal lines 128 in all of the rows and to operate only while the signal CONF is active. Thus, unnecessary operation can be avoided. This contributes to, for example, reduced power consumption.

Although the gate voltage Vgs is adjusted every time each pixel signal is read out in the above-mentioned example, the gate voltage Vgs may be adjusted only at the initial readout. Alternatively, in response to several readouts of the pixel signals from the same row, the gate voltage Vgs applied to the light receiving elements 10 in the relevant row may be adjusted.

The individual light receiving element 10 has the configuration similar to that of a "p-type MOS field-effect transistor" in the above-mentioned example. Alternatively, the individual light receiving element 10 may have a configuration similar to that of an n-type MOS field-effect transistor.

Second Embodiment

Figure 13:
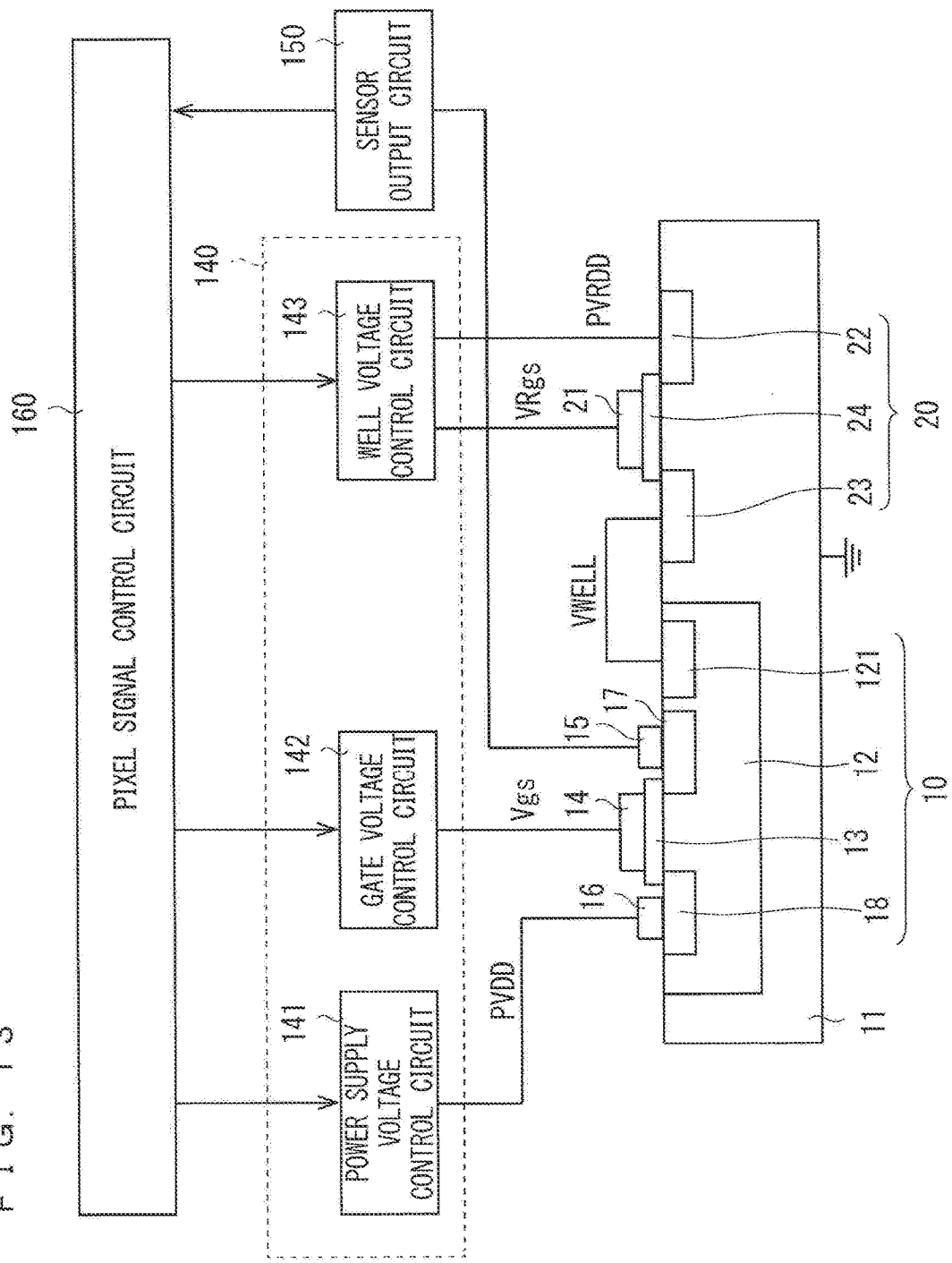
FIG. 13 is a diagram schematically illustrating an example configuration of the image sensor.

FIG. 13 schematically illustrates an example configuration of the light receiving element 10 and an example configuration of peripheral circuitry. FIG. 13 additionally illustrates an example configuration of the reset switch 20. The reset switch 20 includes, for example, a gate electrode 21, a drain region 22, a source region 23, and an insulation layer 24. The drain region 22 and the source region 23 may be formed in the upper portion of the semiconductor layer 11. The drain region 22 and the source region 23 are semiconductor layers having the conductivity type (here, the n-type) that is different from the conductivity type of the semiconductor layer 11 (here, the p-type).

The source region 23 is connected with the semiconductor layer 12 through a wire. In the illustration of FIG. 13, a semiconductor layer 121 having the same conductivity type as that of the semiconductor layer 12 and containing a highly concentrated impurity is formed in the upper portion of the semiconductor layer 12. The semiconductor layer 121 is connected with the source region 23 through a wire. The semiconductor layer 121 provides a low-resistance connection between the semiconductor layer 12 and the source region 23.

The insulation layer 24 is located on at least part of the semiconductor layer 11 between the drain region 22 and the source region 23. The gate electrode 21 is located on the insulation layer 24. In other words, the gate electrode 21 confronts, through the insulation layer 24, the portion sandwiched between the drain region 22 and the source region 23.

The reset switch 20 mentioned above is a "MOS field-effect transistor".

FIG. 13 illustrates the peripheral circuitry including a voltage control circuit 140, a sensor output circuit 150, and a pixel signal control circuit 160.

As will be described below in detail, the voltage control circuit 140 controls at least one of the following voltages based on the pixel signals output by the sensor output circuit 150. That is, the voltage control circuit 140 controls at least one of a power supply potential (hereinafter also referred to as a "power supply voltage PVDD") applied to the drain electrode 16, the gate voltage Vgs applied to the gate electrode 14, or a potential (hereinafter also referred to as a "well voltage VWELL") applied to the semiconductor layer 12. These voltages are also collectively referred to as control target voltages.

In the illustration of FIG. 13, the voltage control circuit 140 includes a power supply voltage control circuit 141, a gate voltage control circuit 142, and a well voltage control circuit 143.

The power supply voltage control circuit 141, whose output side is connected with the drain electrode 16, outputs the variable power supply voltage PVDD to the drain region 18 through the drain electrode 16. The circuit that outputs a variable voltage is known and will not be described here in detail. Examples of such a circuit include an amplifier having a controllable amplification factor. The power supply voltage control circuit 141 receives, from the pixel signal control circuit 160, a command associated with the value of the power supply voltage PVDD. The power supply voltage control circuit 141 outputs the power supply voltage PVDD based on the command. The power supply voltage control circuit 141 is equivalent to the direct-current power source E1 in the first embodiment.

The gate voltage control circuit 142, whose output side is connected with the gate electrode 14, outputs the variable gate voltage Vgs to the gate electrode 14. Examples of such a circuit that outputs a variable output voltage include an amplifier having a controllable amplification factor. The gate voltage control circuit 142 receives, from the pixel signal control circuit 160, a command associated with the value of the gate voltage Vgs, and then, outputs the gate voltage Vgs based on the command. The gate voltage control circuit 142 and the gate voltage generation unit 40 according to the first embodiment have the same function but determine the gate voltage Vgs in different manners. In the second embodiment, the gate voltage Vgs is determined according to the pixel signals as will be specifically described below.

The well voltage control circuit 143 is a circuit for controlling a potential (hereinafter referred to as the well voltage VWELL) applied to the semiconductor layer 12. In the illustration of FIG. 13, the variable well voltage VWELL is output to the semiconductor layer 12 through the use of the reset switch 20. For example, the well voltage control circuit 143 is connected with the gate electrode 21 of the reset switch 20 and is also connected with the drain region 22. The well voltage control circuit 143 is connected with the drain region 22 through an electrode (not shown).

The well voltage control circuit 143 outputs a gate voltage VRgs, which is variable, to the gate electrode 21 and outputs a voltage PVRDD, which is variable, to the drain region 22. The gate voltage VRgs and the voltage PVRDD are controlled, and the well voltage VWELL applied to the semiconductor layer 12 is accordingly controlled. For example, an increase in the voltage PVRDD pushes the well voltage VWELL higher. Examples of such a circuit that outputs the variable output voltage include an amplifier having a controllable amplification factor. The well voltage control circuit 143 includes, for example, two such circuits, one for outputting the gate voltage Vgs and the other for outputting the voltage PVRDD.

The well voltage control circuit 143 receives, form the pixel signal control circuit 160, a command associated with the value of the well voltage VWELL and outputs the gate voltage VRgs and the voltage PVRDD so as to apply, onto the semiconductor layer 12, the well voltage VWELL based on the command.

In the first embodiment, one example is that the individual pixel 110 detects the amount of light in the state in which the reset switch 20 turned off. Then, the reset switch 20 is turned on in order to initialize the potential applied to the semiconductor layer 12. This does not necessarily hold true for the second embodiment. For example, the individual pixel 110 may output the current IPMOS in the state in which the reset switch 20 is turned on, or, in the state in which the well voltage VWELL is applied to the semiconductor layer 12. In this case as well, the current IPMOS responsive to the amount of light flows due to the tunneling effect in the path passing through the drain region 18, the gate electrode 14, and the source region 17 as disclosed in Patent Document 2.

The input side of the sensor output circuit 150 is connected with the source electrode 15 of the light receiving element 10. The sensor output circuit 150 includes, for example, the pixel selection switch 30 and the current readout unit 130 mentioned above. The sensor output circuit 150 (specifically, the current readout unit 130) outputs the current IPMOS as a pixel signal. The pixel signal is input to the pixel signal control circuit 160.

The pixel signal control circuit 160 receives input of the pixel signal and outputs, based on the pixel signal, a command to the voltage control circuit 140, whereby at least one of the gate voltage Vgs, the power supply voltage PVDD, or the well voltage VWELL is controlled. Thus, the gate voltage Vgs, the power supply voltage PVDD, and the well voltage VWELL can be controlled based on the pixel signal output by the individual pixel 110.

For example, when the pixel value indicated by the pixel signal is greater than the upper limit value, the pixel signal control circuit 160 may control at least one of the gate voltage Vgs, the power supply voltage PVDD, or the well voltage VWELL in order to reduce the pixel value. FIG. 14 is a flowchart illustrating an example of the above-mentioned control. Firstly, in Step ST1, the pixel signal control circuit 160 determines whether the pixel value output by the sensor output circuit 150 is greater than the upper limit value. Such a determination can be made through the use of a known comparator. This holds true for other types of comparison which will be described below, and thus, the above description will not be repeated. The upper limit value and a reference value may be determined in advance and may be stored in a predetermined storage (not shown). The reference value may be zero.

If it is determined in Step ST1 that the pixel value is smaller than the upper limit value, Step ST1 is performed again.

If it is determined in Step ST1 that the pixel value is greater than the reference value, in Step ST2, the pixel signal control circuit 160 controls the control target voltage so as to reduce the pixel value. For example, the pixel signal control circuit 160 outputs a command to reduce the power supply voltage PVDD to the power supply voltage control circuit 141, outputs a command to reduce the gate voltage Vgs to the gate voltage control circuit 142, or outputs a command to reduce the well voltage VWELL to the well voltage control circuit 143.

In response to the command, the gate voltage control circuit 142 may reduce the gate voltage Vgs and output the resultant voltage to the gate electrode 14. In response to the command, the power supply voltage control circuit 141 may reduce the power supply voltage PVDD and output the resultant voltage to the drain region 18. In response to the command, the well voltage control circuit 143 may change the gate voltage VRgs and/or the voltage PVRDD so as to reduce the well voltage VWELL. Consequently, the current IPMOS is reduced, and the pixel value is accordingly reduced. Thus, the pixel value is less likely to exceed the upper limit value. This can avoid a situation in which the amount of light is failed to be detected properly due to the pixel value in excess of the upper limit value.

The voltage control circuit 140 may output a common control target voltage to the light receiving elements 10 in all of the pixels 110. For example, when the difference between the upper limit value and any one of the pixel values of the pixels 110 exceeds the reference value, a common control target voltage that is low enough to reduce the pixel value of the relevant pixel 110 may be output to the light receiving elements 10 in all of the pixels 110.

The control of the control target voltage based on the pixel value is not limited to the above-mentioned example and may be changed as appropriate.

Figure 15:
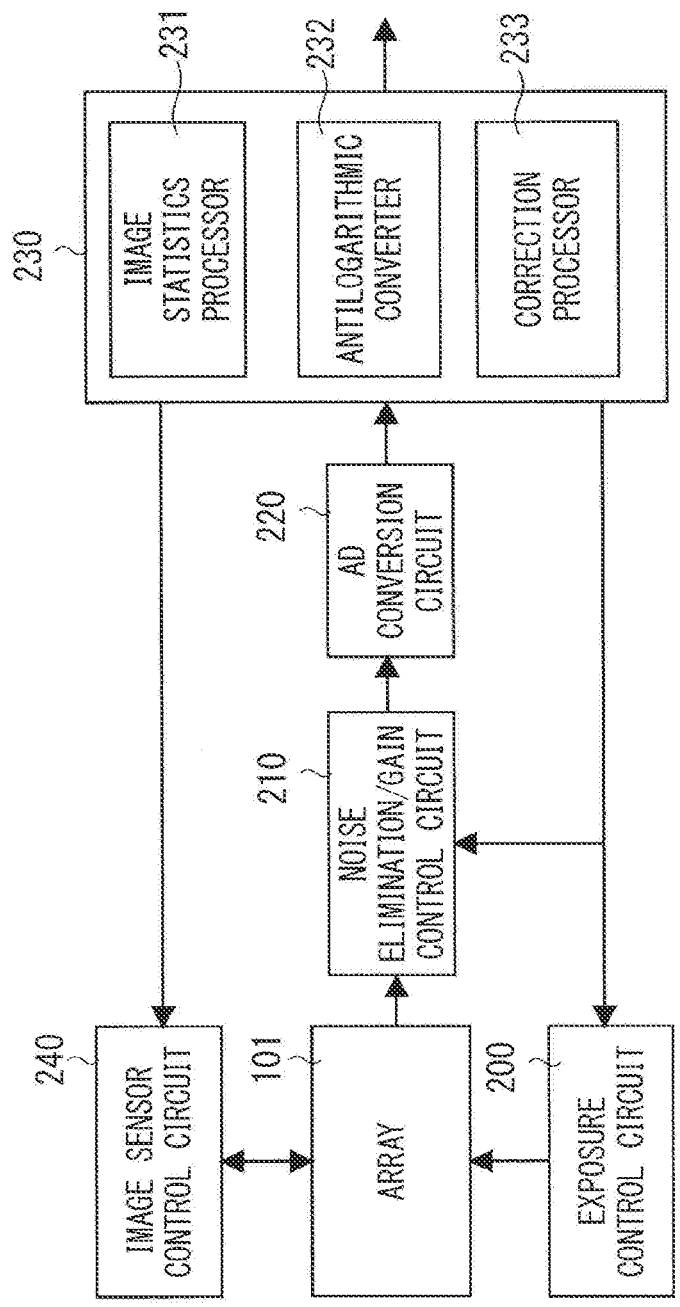
FIG. 15 is a diagram schematically illustrating an example configuration of the image sensor.

Although the control target voltage is controlled based on the pixel signal from (the pixel value of) the individual pixel 110 in the illustration of FIG. 13, the control target voltage may be controlled in a different manner. The control target voltage may be controlled based on the pixel signals from the plurality of pixels 110. FIG. 15 illustrates another example of the image sensor 100. In the illustration of FIG. 15, the image sensor 100 includes a pixel array 101, an exposure control circuit 200, a noise elimination/gain control circuit 210, an AD conversion circuit 220, an image signal processing circuit 230, and an image sensor control circuit 240.

The pixel array 101 includes the pixels 110, the row selector 132, the current readout unit 130, and the voltage control circuit 140, which have been mentioned above.

The exposure control circuit 200 controls the exposure time of the pixels 110 based on information (which will be described below) received from the image signal processing circuit 230. For example, the exposure time may be controlled by exercising control of the timing at which a reset signal is transmitted to the reset switch 20. The reason for this is that the exposure time can be changed according to the timing at which the reset switch 20 is turned on although the exposure time is dependent on the amount of light as described in the first embodiment.

A shutter (not shown) may be provided. The shutter permits selection between passage and blockage of light incident on the light receiving elements 10. When the shutter is open, light enters the light receiving elements 10. When the shutter is closed, the entry of light into the light receiving elements 10 is blocked. The exposure time may be controlled by exercising the control of the opening and closing of the shutter.

The noise elimination/gain control circuit 210 performs noise elimination processing or amplification processing on pixel signals output from the pixel array 101, thereby correcting the pixel signals. The noise elimination processing and the amplification processing may be performed by a known circuit.

The AD conversion circuit 220 converts the analog data indicative of the pixel signals output from the noise elimination/gain control circuit 210 into digital data, and then outputs the resultant data to the image signal processing circuit 230.

The image signal processing circuit 230 can perform various types of image processing on the pixel signals. The image signal processing circuit 230 includes, for example, an image statistics processor 231, an antilogarithmic converter 232, and a correction processor 233.

The antilogarithmic converter 232 performs an antilogarithmic conversion of a pixel signal (pixel value). In a case where the pixel value is proportionate to the logarithm of the amount of light, the antilogarithmic conversion of the pixel value is performed so as to proportion the resultant pixel value to the amount of light. Thus, the pixel value can be processed in the linear region.

The image processing designed for conventional image sensors in which the pixel value is proportionate to the amount of light can be performed without any alterations. For example, the correction processor 233 performs, on the pixel signal, various types of image processing including pixel interpolation processing, gamma correction, edge enhancement, and color correction. As mentioned above, the conventionally employed gamma correction may be performed, without any alterations, on the pixel value converted by the antilogarithmic converter 232. This holds true for other types of image processing, where the image processing designed for conventional image sensors in which the pixel value is proportionate to the amount flight can be performed without any alterations.

The image statistics processor 231 computes a statistic (hereinafter also referred to as "image statistical information") based on a pixel signal. The pixel statistical information may be any piece of statistical information and may include at least one of the maximum value, the minimum value, the sum total, the mean value, the mode, the variance, or the standard deviation of the pixel signals from all of the pixels 110. A signal composed of the pixel signals from all of the pixels 110 is hereinafter also referred to as an "image signal".

Figure 16:
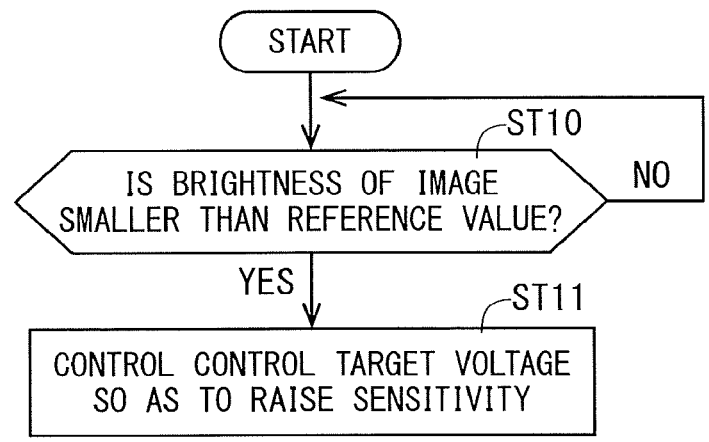
FIG. 16 is a flowchart illustrating an example operation of the pixel signal control circuit.

The image statistical information may be, for example, the sum total or the mean value of the pixel signals. The sum total or the mean value indicates the overall brightness of an image. The image sensor control circuit 240 may control the control target voltage so as to adjust the sensitivity according to the image statistical information (brightness). As illustrated in FIG. 16, in Step ST10, the image sensor control circuit 240 compares the image statistical information with a predetermined reference value of brightness and determines whether the image statistical information is smaller than the reference value of brightness. The reference value of brightness is set in advance and is stored in a predetermined storage.

If it is determined in Step ST10 that the image statistical information is greater than the reference value of brightness, Step ST10 is performed again.

If it is determined in Step ST10 that the image statistical information is smaller than the reference value of brightness, in Step ST11, the image sensor control circuit 240 outputs a command to at least one of the power supply voltage control circuit 141, the gate voltage control circuit 142, or the well voltage control circuit 143 so as to, for example, raise the sensitivity. That is to say, in a case where the brightness of an image is low, at least one of the gate voltage Vgs, the power supply voltage PVDD, or the well voltage VWELL is controlled so as to raise the sensitivity. For example, upon receipt of the above-mentioned command, the power supply voltage control circuit 141 increases the power supply voltage PVDD and outputs the resultant voltage. The sensitivity is accordingly raised, so that a signal indicative of a brighter image can be obtained.

The brightness is not necessarily determined based on two values as mentioned above and may be determined based on multiple values. The control target voltages (the gate voltage Vgs, the power supply voltage PVDD, and the well voltage VWELL) may be continuously controlled according to the brightness. This holds true for other types of control mentioned herein and the above description will not be repeated.

The higher sensitivity may lead to a shorter exposure time. In other words, an image signal can be obtained after a lapse of a shorter exposure time. This is suited to imaging an object moving at a high speed. That is to say, in a case where a shorter exposure time is required, the image sensor control circuit 240 may output a command to at least one of the power supply voltage control circuit 141, the gate voltage control circuit 142, or the well voltage control circuit 143 so as to improve the sensitivity.

The amount of dark current tends to increase with increasing sensitivity. The dark current is the current IPMOS that is not responsive to the amount of light. The image sensor control circuit 240 may control the well voltage VWELL so as to reduce the amount of dark current. Owing to the body effect, the threshold voltage Vth can be controlled based on changes in the well voltage VWELL as mentioned above, and the dark current can be controlled accordingly. Specifically, the well voltage VWELL may be changed so as to increase the threshold voltage Vth. This can reduce the amount of dark current. Thus, a higher signal-to-noise (SN) ratio can be achieved.

The amount of dark current can be reduced in the above-mentioned manner. This eliminates the need for an additional analog circuit and the like for reducing the amount of dark current, thus contributing to reduced manufacturing cost.

Another example of the image statistical information may be the difference between the maximum value and the minimum value of the pixel values of all of the pixels 110. The dynamic range needs to be expanded as the image statistical information increases. Thus, the control target voltage may be controlled in such a manner that the dynamic range is expanded as the image statistical information increases.

Figure 17:
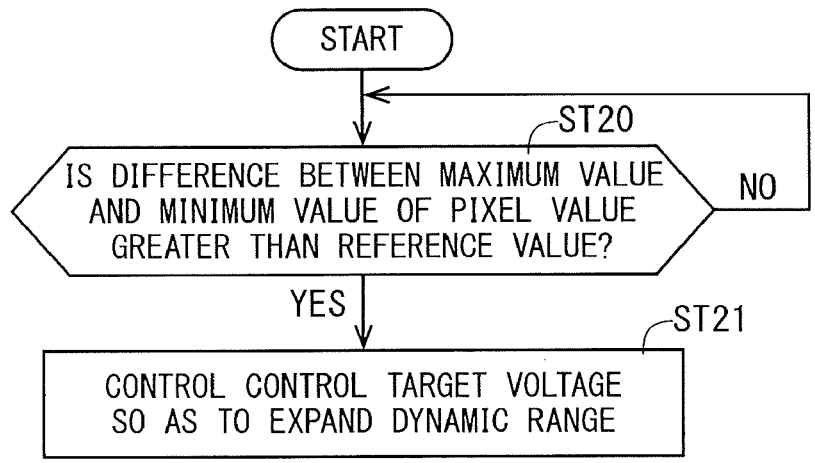
FIG. 17 is a flowchart illustrating an example operation of the pixel signal control circuit.

For example, as illustrated in FIG. 17, in Step ST20, the image sensor control circuit 240 compares the image statistical information (the difference between the maximum value and the minimum value) with a range reference value to determine whether the difference is greater than the range reference value. The range reference value may be determined in advance and be stored in a predetermined storage.

If it is determined in Step ST20 that the image statistical information is smaller than the range reference value, Step ST20 is performed again.

If it is determined in Step ST20 that the image statistical information is greater than the range reference value, in Step ST21, the image sensor control circuit 240 outputs a command to at least one of the power supply voltage control circuit 141, the gate voltage control circuit 142, or the well voltage control circuit 143 so as to expand the dynamic range. That is to say, the image sensor control circuit 240 controls at least one of the gate voltage Vgs, the power supply voltage PVDD, or the well voltage VWELL so as to expand the dynamic range. For example, upon receipt of the command, the power supply voltage control circuit 141 increases the power supply voltage PVDD and outputs the resultant voltage. Thus, the amount of light and the current IPMOS have a strong exponential relation therebetween, so that a wider dynamic range can be achieved.

The logarithmic relation between the amount of light and the current IPMOS may be stored in a predetermined storage in advance for each set of the gate voltage Vgs, the power supply voltage PVDD, and the well voltage VWELL. The gate voltage Vgs, the power supply voltage PVDD, and the well voltage VWELL may be input to the antilogarithmic converter 232. Then, the antilogarithmic converter 232 may read the logarithmic relation corresponding to these voltages and perform the antilogarithmic conversion on the pixel signal using the logarithmic relation. Thus, the pixel signals can be properly processed in the linear region.

The relation between the amount of light and the current IPMOS may be adjusted according to the gate voltage Vgs, the power supply voltage PVDD, and the well voltage VWELL. Specifically, the amount of light may have, instead of the logarithmic relation, an approximately linear relation with the current IPMOS. In this case, the antilogarithmic converter 232 may be eliminated.

Additionally, the image signal processing circuit 230 can perform image processing to control exposure. For example, exposure is controlled in such a manner that the exposure control circuit 200 controls the exposure time according to the brightness of an image and/or that the noise elimination/gain control circuit 210 controls gains according to the brightness of the image. Specifically, the image statistics processor 231 may add up the pixel signals from (pixel values of) all of the pixels 110 to calculate the overall brightness and may determine the exposure time based on the calculated brightness. For example, the exposure control circuit 200 sets a short exposure time when the brightness is high. Thus, the pixel signals can be obtained after a lapse of a more appropriate exposure time.

In this embodiment, the brightness may be adjusted according to at least one of the power supply voltage PVDD, the gate voltage Vgs, or the well voltage VWELL as mentioned above. Assuming that the exposure time is controlled according to the brightness, the exposure time is also adjusted based on the above-mentioned voltages in this embodiment. This means that the image sensor control circuit 240 and the exposure control circuit 200 cooperate with each other to control exposure. This translates into increased number of control parameters, providing greater control over exposure.

The above-mentioned control method is merely an example and any other method may be employed. Essentially, the target control voltage needs to be controlled based on the image statistical information.

The second embodiment can constitute a feedback system responsive to the pixel signals, so that imaging can be performed by the image sensor having properties (e.g., the sensitivity or the dynamic range) suited to the image signal.

In some embodiments, no gate voltage Vgs may be applied. For example, the gate electrode 14 may be in a "floating state". In this case, no gate voltage Vgs is output and no gate voltage control circuit 142 is accordingly provided.

The control target voltage may be at least one of the power supply voltage PVDD, the gate voltage Vgs, or the well voltage VWELL. The power supply voltage control circuit 141, the gate voltage control circuit 142, and the well voltage control circuit 143 may be provided on as-needed basis in order to control the corresponding control target voltages.

The second embodiment constitutes a feedback system that controls the gate voltage Vgs, the power supply voltage PVDD, and the well voltage VWELL based on the image signal, thereby stabilizing the pixel signals. In particular, the sensitivity of the image sensor 100 is more than ten thousand times as high as that of a conventional sensor such as a contact image sensor (CIS). The dynamic range is more than or equal to 120 dB. However, the higher sensitivity and the wider dynamic range may cause the output (pixel signals) from the image sensor 100 to be susceptible to variable factors such as variations in manufacturing process or power supply variations.

To stabilize the output, at least one of the power supply voltage PVDD, the gate voltage Vgs, or the well voltage VWELL may be controlled in a manner to respond to the output from the pixel signals. For example, at least one of the gate voltage Vgs, the power supply voltage PVDD, or the well voltage VWELL may be controlled in such a manner that the brightness (the sum total or the mean value of the pixel values) falls within a certain range.

Power Consumption

Figure 18:
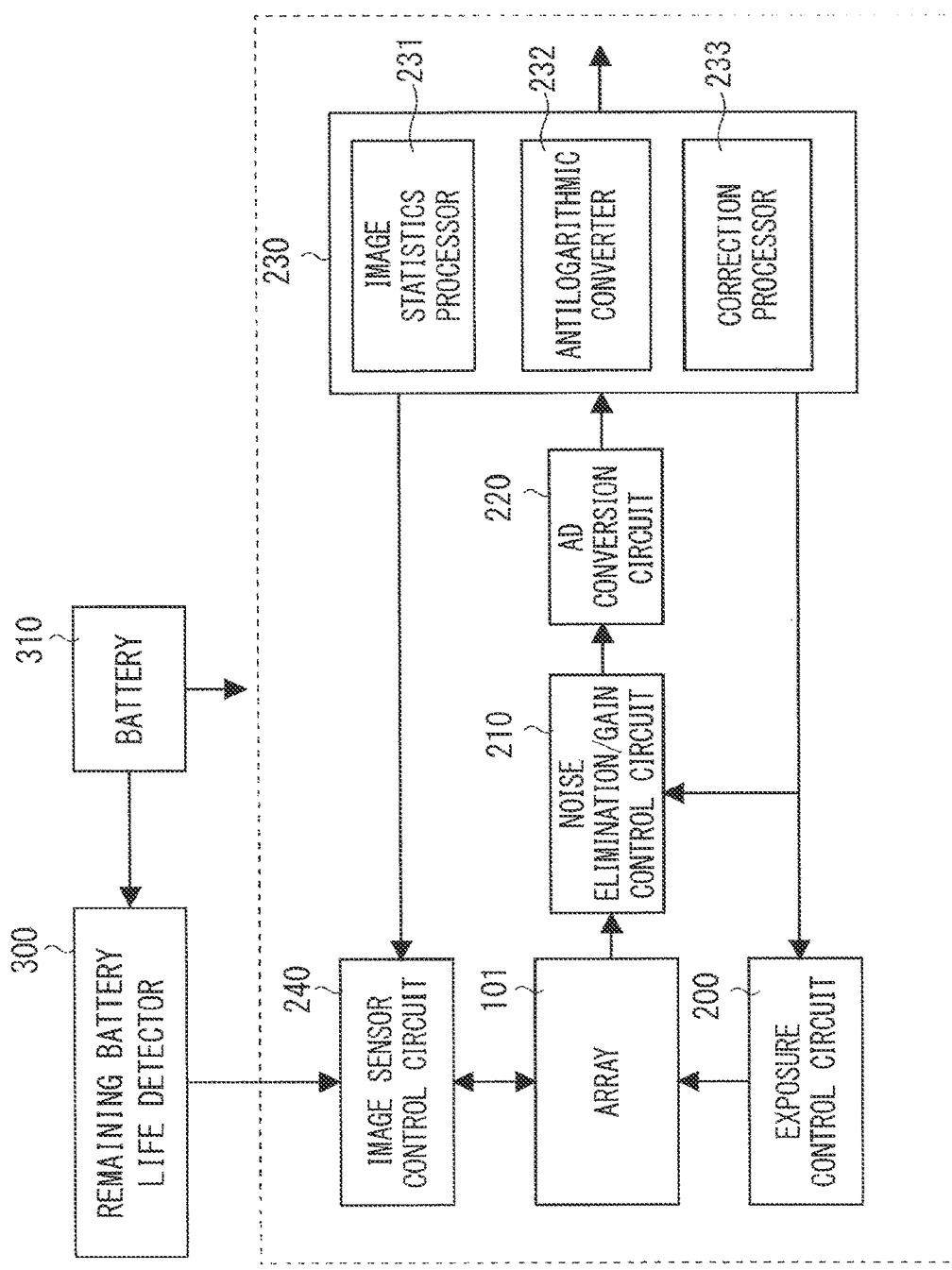
FIG. 18 is a diagram schematically illustrating an example configuration of the image sensor.

For example, power consumption increases as the power supply voltage PVDD increases. This means that operating the image sensor at the lower power supply voltage PVDD can reduce power consumption. With reference to FIG. 18, a battery 310 and a remaining battery life detector 300 are provided. The battery 310, which is a typical battery, supplies power to the individual circuits mentioned above. The remaining battery life detector 300 detects the remaining battery life of the battery 310 and outputs the detected battery life to the image sensor control circuit 240.

When the remaining battery life is short, the image sensor control circuit 240 may output, to the power supply voltage control circuit 141, a command to reduce the power supply voltage PVDD such that the power consumption is reduced. Specifically, the image sensor control circuit 240 may compare the remaining battery life with a remaining life reference value. The remaining life reference value may be determined in advance and be stored in a predetermined storage. When it is determined that the remaining battery life falls below the remaining life reference value, the image sensor control circuit 240 outputs, to the power supply voltage control circuit 141, a command to reduce the power supply voltage PVDD. This can delay the timing at which battery 310 reaches the end of its life. In other words, the image sensor 100 can operate over a longer period of time.

Area Setting

Figure 19:
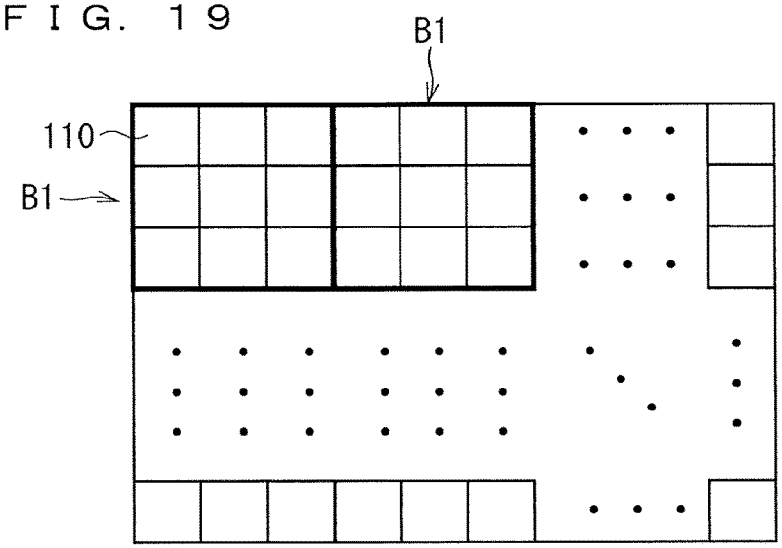
FIG. 19 is a diagram schematically illustrating example areas.

A plurality of areas composed of the pixels 110 may be set and the control target voltage may be controlled per area. These areas constitute an image and do not overlap one another. Each pixel 110 belongs to one of these areas. As illustrated in FIG. 19, the pixels 110 are arranged in matrix. In the illustration of FIG. 19, an area B1 is composed of nine pixels 110 arranged in a matrix with three rows and three columns. A plurality of areas B1 are also arranged in matrix.

Figure 20:
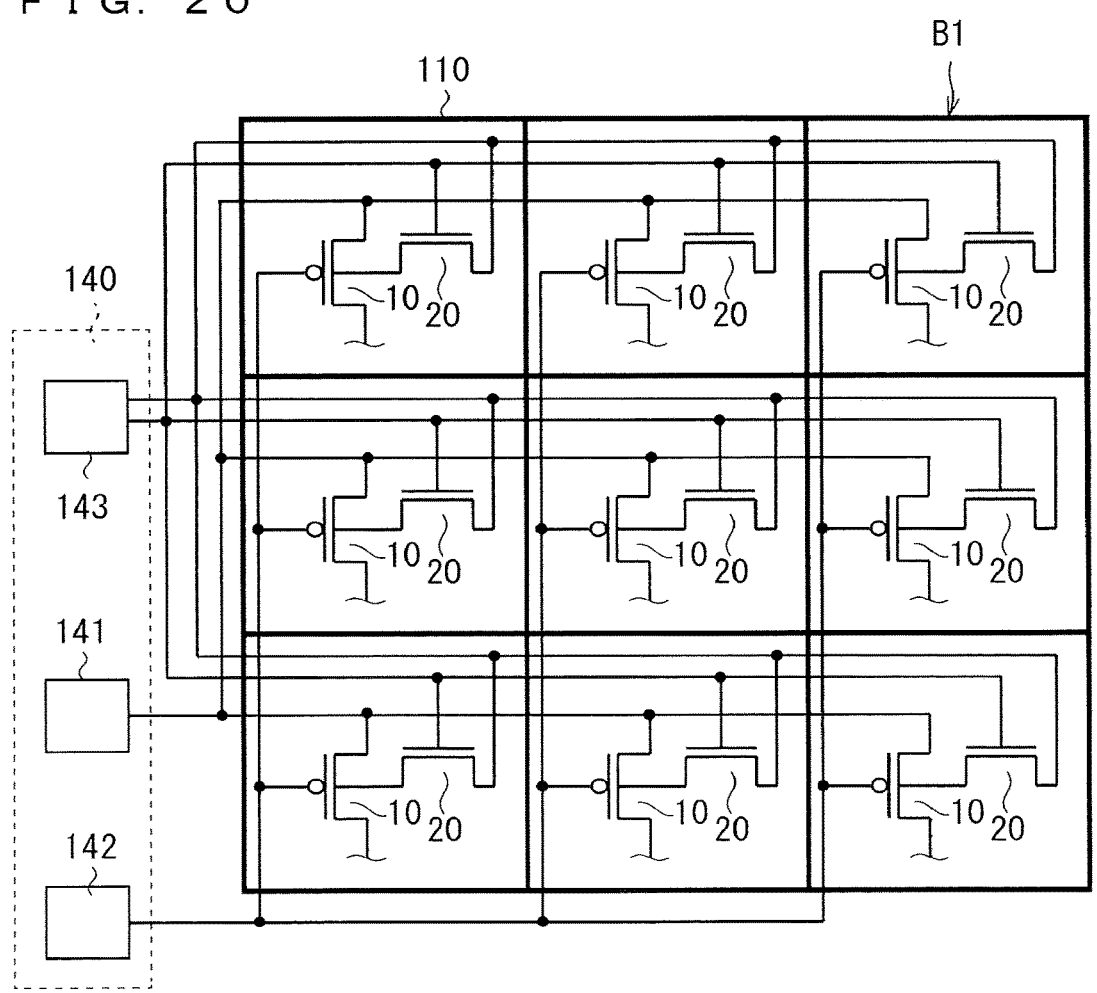
FIG. 20 is a diagram schematically illustrating a voltage control circuit and one of the example areas.

For example, the voltage control circuit 140 may be provided in each area B1. FIG. 20 schematically illustrates one of the areas B1 and one of a plurality of voltage control circuits 140. FIG. 20 eliminates components located in the pixels 110 except for the light receiving elements 10 and the reset switches 20.

In the illustration of FIG. 20, the individual voltage control circuits 140 correspond one-to-one to the individual areas B1. Specifically, the power supply voltage control circuit 141 is commonly connected with the drain regions 18 of all of the light receiving elements 10 belonging to the area B1. The gate voltage control circuit 142 is commonly connected with the gate electrodes 14 of all of the light receiving elements 10 belonging to the area B1. The well voltage control circuit 143 is commonly connected with the gate electrodes 21 of all of the reset switches 20 belonging to the area B1 and is also connected with the drain regions 22 of all of the reset switches 20 belonging to the area B1. The control target voltages can be accordingly controlled for each area B1.

For example, the image sensor control circuit 240 outputs a command to each of the voltage control circuits 140 based on the image statistical information, thereby constituting a feedback system based on the pixel signals in each of the areas B1. Thus, the properties of the image sensor 100 (e.g., the sensitivity or the dynamic range) can be controlled for each area B1.

The individual voltage control circuits 140 may correspond one-to-one to the individual pixels 110. Thus, the control target voltages can be controlled for each pixel 110.

Figure 21:
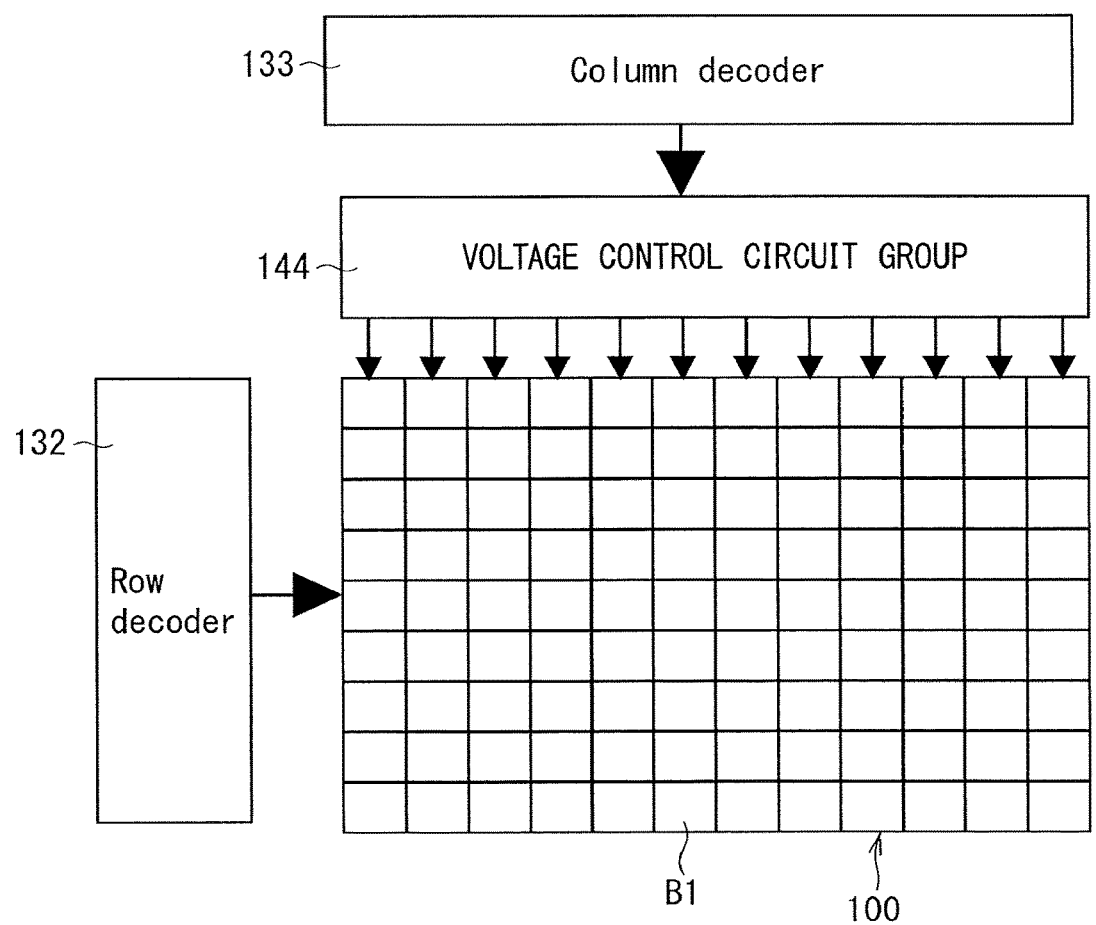
FIG. 21 is a diagram schematically illustrating an example configuration of the image sensor.

With reference to FIG. 21, a voltage control circuit group 144 is provided. The voltage control circuit group 144 includes, for example, the plurality of voltage control circuits 140. The individual voltage control circuits 140 correspond one-to-one to the individual areas B1 (see FIG. 20). The voltage control circuit group 144 may be controlled by a decoder circuit 133 for outputting a command per block.

Each of the voltage control circuits 140 may be provided for all of the areas B1 in the corresponding one of columns. In this case, the number of the voltage control circuits 140 is the same as the number of the columns of the matrix of the areas B1. The exposure of the areas B1 may be performed, one row at a time. While the exposure of the areas B1 in the first row is performed, the control target voltages in each of the areas B1 in the first row are controlled independently of the control target voltages in the other ones of the areas B1 in the first row. While the exposure of the areas B1 in the second row is performed, the control target voltages are controlled by each of the voltage control circuits 140 provided for the corresponding one of columns. The control target voltages in each of the areas B1 in the second row are controlled independently of the control voltages in the other ones of the areas B1 in the second row, and so on.

Similarly, each of the voltage control circuits 140 may be provided for all of the areas B1 in the corresponding one of rows. In this case, the exposure of the areas B1 may be may be performed, one column at a time.

The above-mentioned configuration is suited to, for example, computer vision. The computer vision involves various types of processing performed on an image signal, recognition of objects and the like contained in an image, and recognition of characters contained in the image. As for computer vision, there is an advantage in setting an appropriate sensitivity, dynamic range, or the like for each of the areas B1 constituting an image as will be described below.

Computer vision which is not intended for viewers do not need to create a high-quality video image nor offer high viewability. In a case where the image sensor 100 is mounted on a vehicle in order to perform vehicle control (e.g., at least one of acceleration, deceleration, or steering) based on image signals captured by the image sensor 100, obtained images do not need to be displayed for viewers. In this case, there is no problem in capturing an image at sensitivities or dynamic ranges that vary considerably among the areas B1.

To facilitate image recognition by computers based on image signals, it is preferred that images be created so as to be easily identified by the computers. Once it is recognized that a person is shown in part of a captured image, the contrast in the areas B1 belonging to the relevant part may be increased compared to the contrast in the areas B1 belonging to the remaining part of the captured image such that the person becomes easily distinguishable during the subsequent imaging. For example, the power supply voltage PVDD in the relevant areas B1 may be decreased compared to the power supply voltage PVDD in the remaining areas B1 so as to increase the linearity of the current IPMOS relative to the amount of light. Although the dynamic range is accordingly reduced, the increased contrast makes a person easily distinguishable.

The above-mentioned control of the sensitivity or the dynamic range for each area B1 offers an optimum image contrast for each area B1, which translates to improved image recognition performance.

Power Supply Per Pixel

The power supply voltage control circuit 141 can control the power supply voltage PVDD for each pixel 110 or each area B1. The power supply voltage control circuit 141 may output the power supply voltage PVDD to some of the pixels 110 and may output no power supply voltage PVDD to the other ones of the pixels 110. Consequently, the relevant pixels 110 alone may be activated, whereby the image sensor 100 may be implemented by these activated pixels 110.

The well voltage VWELL is controlled through the use of the reset switches 20 in the second embodiment. Alternatively, the well voltage control circuit 143 may directly output the variable well voltage VWELL to the semiconductor layer 121 without using the reset switch 20.

The image sensor 100 may be an area sensor or a line sensor including the multiple pixels 110 or may be a sensor (e.g., an illuminance sensor) including a single pixel 110.

The various functional units or circuits mentioned above may be implemented by hardware or may be implemented by software.

The image sensor 100 mentioned above may be used as a sensor capable of receiving not only visible light but also other types of light. For example, such a sensor can receive near-infrared radiation and/or near-ultraviolet radiation.

While the image sensor 100 has been described in detail, the foregoing description is in all aspects illustrative and not restrictive. The various modifications described above are applicable in combination as long as they are consistent with each other. It is understood that numerous modifications which have not been exemplified can be devised without departing from the scope of the invention.

EXPLANATION OF REFERENCE NUMERALS 10 light receiving element
11, 12 semiconductor layer
13 insulation layer
14 gate electrode
15 source electrode
16 drain electrode
20 reset switch
30 pixel selection switch
40 gate voltage generation unit
42, 130 current readout unit
140 voltage control circuit
141 power supply voltage control circuit
142 gate voltage control circuit
143 well voltage control circuit

The invention claimed is:

1. An image sensor comprising:
    at least one light receiving element including
        a first semiconductor layer of a first conductivity type to which a first power supply potential is to be applied,
        a second semiconductor layer of a second conductivity type formed on the first semiconductor layer, the at least one light receiving element receiving light incident on a junction between the first semiconductor layer and the second semiconductor layer,
        a first region of the first conductivity type and a second region of the first conductivity type that are formed to be apart from each other in an upper portion of the second semiconductor layer,
        a first electrode that is located on the first region and is to be subjected to application of a second power supply potential different from the first power supply potential,
        a second electrode located on the second region,
        an insulation layer formed on the second semiconductor layer between the first region and the second region, and
        a gate electrode that is formed on the insulation layer and is to be subjected to application of a gate voltage; and
    a current readout unit including circuitry configured to detect, as a pixel signal reflecting an amount of light received by the at least one light receiving element, a current flowing from the first region to the second region.

2. The image sensor according to claim 1, wherein the gate electrode is made of a semiconductor of the first conductivity type.

3. The image sensor according to claim 1, further comprising:

a reset wire to which a reset potential is to be applied; and at least one reset switch located between the second semiconductor layer and the reset wire, wherein the at least one reset switch is turned on to reset a potential applied to the second semiconductor layer to the reset potential, and then, the at least one reset switch is turned off, and the circuitry of the current readout unit is configured to detect the current as the pixel signal after a lapse of a predetermined period since a turn-off of the at least one reset switch.

4. The image sensor according to claim 3, further comprising a gate voltage generation unit including circuitry configured to receive input of the current flowing in a state in which the at least one reset switch is on, and output a voltage to the gate electrode in such a manner that a difference between the input current and a predetermined current set value falls below a predetermined value.

5. The image sensor according to claim 4, further comprising:

a plurality of gate switches;

a plurality of pixel selection switches; and a signal line, wherein the at least one light receiving element comprises a plurality of the light receiving elements and the at least one reset switch comprises a plurality of the reset switches, each of the plurality of pixel selection switches is located between the signal line and corresponding one of the plurality of light receiving elements, an output terminal of the circuitry of the gate voltage generation unit is connected with the gate electrode of each of the plurality of light receiving elements through corresponding one of the plurality of gate switches, the circuitry of the current readout unit is configured to detect a current flowing through the signal line, and the circuitry of the gate voltage generation unit is configured to repeatedly execute, for each of the plurality of light receiving elements, receiving, from the circuitry of the current readout unit, input of a current flowing through the signal line in a state in which the reset switch, the gate switch, and the pixel selection switch that are connected with one of the plurality of light receiving elements are on, and outputting a voltage in such a manner that a difference between the input current and the current set value falls below a predetermined value.

6. An image sensor comprising:

at least one light receiving element including a first semiconductor layer of a first conductivity type to which a first power supply potential is to be applied, a second semiconductor layer of a second conductivity type formed on the first semiconductor layer, a first region of the first conductivity type and a second region of the first conductivity type that are formed to be apart from each other in an upper portion of the second semiconductor layer, a first electrode that is located on the first region and is to be subjected to application of a second power supply potential different from the first power supply potential, a second electrode located on the second region, an insulation layer formed on the second semiconductor layer between the first region and the second region, and a gate electrode formed on the insulation layer;

a current readout unit including circuitry configured to detect, as a pixel signal, a current flowing from the first region to the second region; and a voltage controller including circuitry configured to control, based on the pixel signal, a control target voltage being at least one of a gate voltage applied to the gate electrode, the second power supply potential, or a potential applied to the second semiconductor layer.

7. The image sensor according to claim 6, further comprising an image statistics processor including circuitry configured to calculate image statistical information based on the pixel signal, wherein the circuitry of the voltage controller is configured to control the control target voltage based on the image statistical information to adjust a sensitivity or a dynamic range of the image sensor.

8. The image sensor according to claim 6, wherein the at least one light receiving element comprises a plurality of the light receiving elements, and the circuitry of the voltage controller is configured to control the control target voltage for each of a plurality of areas set for the plurality of light receiving elements.

9. The image sensor according to claim 6, wherein the at least one light receiving element comprises a plurality of the light receiving elements, and the circuitry of the voltage controller is configured to output the second power supply potential to only part of the plurality of light receiving elements.

* * * * *

UNITED STATES PATENT AND TRADEMARK OFFICE
CERTIFICATE OF CORRECTION

PATENT NO. : 10,075,664 B2
APPLICATION NO. : 15/422015
DATED : September 11, 2018
INVENTOR(S) : Yukihiro Ukai and Takashi Sawada Page 1 of 1

It is certified that error appears in the above-identified patent and that said Letters Patent is hereby corrected as shown below:

On the Title Page

Insert item (63):
--Related U.S. Application Data
(63) Continuation of application No. PCT/JP2015/076377, filed September 17, 2015.--

Signed and Sealed this
Fifteenth Day of January, 2019

Andrei Iancu
*Director of the United States Patent and Trademark Office*